US011417955B2

(12) United States Patent
Morita et al.

(10) Patent No.: US 11,417,955 B2
(45) Date of Patent: Aug. 16, 2022

(54) ANTENNA DEVICE

(71) Applicant: MORITA TECH CO., LTD., Kawasaki (JP)

(72) Inventors: Osamu Morita, Kawasaki (JP); Akinori Saeki, Kawasaki (JP); Kei Okamoto, Kawasaki (JP); Satoshi Ogura, Kawasaki (JP)

(73) Assignee: MORITA TECH CO., LTD., Kawasaki (JP)

( * ) Notice: Subject to any disclaimer, the term of this patent is extended or adjusted under 35 U.S.C. 154(b) by 17 days.

(21) Appl. No.: 17/250,502

(22) PCT Filed: Aug. 10, 2018

(86) PCT No.: PCT/JP2018/030022
§ 371 (c)(1),
(2) Date: Jan. 28, 2021

(87) PCT Pub. No.: WO2020/031364
PCT Pub. Date: Feb. 13, 2020

(65) Prior Publication Data
US 2021/0313690 A1    Oct. 7, 2021

(51) Int. Cl.
*H01Q 1/48* (2006.01)
*H01Q 17/00* (2006.01)
*H01Q 5/25* (2015.01)

(52) U.S. Cl.
CPC ............ *H01Q 5/25* (2015.01); *H01Q 17/001* (2013.01)

(58) Field of Classification Search
CPC ........ H01Q 17/00; H01Q 17/001; H01Q 5/25; H01Q 5/50; H01Q 1/48; H01Q 1/38;
(Continued)

(56) References Cited

U.S. PATENT DOCUMENTS 4,628,322 A * 12/1986 Marko .................. H01Q 19/26
343/702
5,337,066 A *  8/1994 Hirata ................. H01Q 17/001
343/793
(Continued)

FOREIGN PATENT DOCUMENTS

JP    2003-533080 A    11/2003
JP    2005-130292 A     5/2005
(Continued)

OTHER PUBLICATIONS

WIPO, Japan Search Authority, International Search Report (with English translation) and Written Opinion dated Oct. 9, 2018 in International Patent Application No. PCT/JP2018/030022, 8 pages.
(Continued)

*Primary Examiner* — Tho G Phan
(74) *Attorney, Agent, or Firm* — Masuvalley & Partners; Peter R. Martinez

(57) ABSTRACT

In the antenna device, a first insulating plate, a capacitive coupling portion of a tuning plate, a radio wave absorber, a grounding portion of the tuning plate folded back to the back side of the radio wave absorber, and a tuning coated plate provided with a metallic plated film formed on the surface thereof are sequentially stacked below an antenna element having a shape obtained by removing an arched portion from a copper circular plate. Power is supplied from a center conductor of a semi-rigid signal input member to a power feeding unit of the antenna element. An external conductor is held between the upper and lower conductive cushions. A grounding plate is conductive with the external conductor, to ground the grounding portion and the tuning coated plate.

10 Claims, 15 Drawing Sheets

(58) Field of Classification Search
CPC . H01Q 9/30; H01Q 9/40; G01R 29/08; G01R 29/0878
See application file for complete search history.

(56) References Cited

U.S. PATENT DOCUMENTS

| | | | | |
|---|---|---|---|---|
| 6,252,552 | B1* | 6/2001 | Tarvas | H01Q 9/0421 343/702 |
| 6,573,867 | B1 | 6/2003 | Desclos et al. | |
| 6,756,932 | B1* | 6/2004 | Barker | H01Q 17/00 342/4 |
| 7,518,560 | B2* | 4/2009 | Hung | H01Q 9/0421 343/702 |
| 8,223,079 | B2* | 7/2012 | Noro | H01Q 1/3275 343/715 |
| 8,410,983 | B2* | 4/2013 | Tsai | H01Q 9/0421 343/702 |
| 11,196,166 | B2* | 12/2021 | Kakuya | H01Q 21/10 |
| 2002/0149519 | A1 | 10/2002 | Varadan et al. | |
| 2004/0100406 | A1 | 5/2004 | Okado | |
| 2005/0062670 | A1 | 3/2005 | Suh et al. | |
| 2005/0088344 | A1 | 4/2005 | Saitou et al. | |
| 2007/0080878 | A1 | 4/2007 | McLean | |
| 2009/0079654 | A1 | 3/2009 | Higaki et al. | |
| 2011/0032155 | A1 | 2/2011 | Yanagi et al. | |
| 2014/0208582 | A1 | 7/2014 | Chen et al. | |
| 2015/0219712 | A1 | 8/2015 | Pouzalgues | |

FOREIGN PATENT DOCUMENTS

| | | |
|---|---|---|
| JP | 2005-277501 A1 | 10/2005 |
| JP | 2006-280009 A | 10/2006 |
| JP | 2008-199371 A | 8/2008 |
| JP | 2009-077238 A | 4/2009 |
| JP | 2009-159291 A | 7/2009 |
| JP | 2011-061758 A | 3/2011 |
| JP | 2011-066865 A | 3/2011 |
| JP | 2012-253808 A | 12/2012 |
| WO | WO2001/084670 A1 | 11/2001 |
| WO | WO2008/018230 A1 | 2/2008 |
| WO | WO2009/082175 A2 | 7/2009 |

OTHER PUBLICATIONS

Extended European Search Report issued in EP 18929811.0 dated Feb. 18, 2022 (5 pages).

* cited by examiner

ANTENNA DEVICE

RELATED APPLICATIONS

This application is the U.S. National Phase of and claims priority to International Patent Application No. PCT/JP2018/030022, International Filing Date Aug. 10, 2018, entitled Antenna Device; which is incorporated herein by reference in its entirety.

FIELD

The present invention relates to an antenna device, and particularly to an antenna device that can communicate with other wireless devices and can conduct a communication test with regard to other wireless devices in a frequency from 600 MHz to 6 GHz to be used in the fifth generation mobile communication (commonly referred to as "sub-6").

BACKGROUND

In recent years, in a mobile communication terminal such as a mobile phone and a smartphone, a transmission and reception frequency of radio waves covers a plurality of bands. When a communication test of these mobile communication terminals is to be conducted, it is required to prepare an antenna designed to match each of frequency bands, each of which is a specific measurement target, and switch the antenna for each of the frequency bands.

A UWB (Ultra Wide Band) wireless system has been known as a wireless system in which one wireless station uses a super-wide frequency band over several hundred MHz to several GHz.

Patent Literature 1 describes a UWB antenna device including a substantially home-base shaped tabular antenna portion and a grounding portion arranged on the same substrate surface with the antenna portion and having a substantially tabular rectangular shape capacitively coupled with the antenna portion, which are provided bilaterally symmetrically as seen in a planar view.

CITATION LIST

Patent Literature

Patent Literature 1: Japanese Patent Application Laid-open No. 2008-199371

SUMMARY

Technical Problem

However, in the antenna device described in Patent Literature 1, a band having a VSWR (Voltage Standing Wave Ratio) of 2.0 or less is 3.1 GHz to 5 GHz, and there is a problem in that the antenna device does not correspond to (match) an 800 MHz band, a 1.5 GHz band, and the like, which are respectively a relatively low frequency used in a mobile phone and a smartphone.

The present invention has been achieved in view of the above circumstances, and an object of the present invention is to provide an antenna device capable of performing communication with a plurality of types of communication devices having different used frequency bands, without switching the antenna device, by causing one antenna device to continuously perform matching over the entire frequency band from 600 MHz to 6 GHz.

Solution to Problem

In order to solve the above problems, the present invention comprises: an antenna element including a circular outer edge in at least a part of an outer edge and a power feeding unit in a part of the circular outer edge; a tuning plate arranged opposite to a rear surface side of the antenna element in an insulated state, and configured by a thin plate-like conductor having a length longer than a maximum diameter of the antenna element, with a region facing the rear surface of the antenna element being designated as a capacitive coupling portion; a radio wave absorber arranged on a rear surface side of the capacitive coupling portion of the tuning plate, to absorb radio waves radiated from the rear surface side of the antenna element; an extra-length portion of the tuning plate folded back to a rear surface side of the radio wave absorber through a side surface portion of the radio wave absorber; a tuning coated plate arranged on a rear surface side of the radio wave absorber and provided with a metallic plating film formed on a surface thereof, to be electrically connected to a grounding portion provided in the extra-length portion of the tuning plate; and a grounding member electrically connected to the tuning coated plate.

Advantageous Effects of Invention

According to the present invention, it is possible to provide an antenna device capable of performing communication with a plurality of types of communication devices having different used frequency bands, without switching the antenna device, by causing one antenna device to continuously perform matching over the entire frequency band from 600 MHz to 6 GHz.

BRIEF DESCRIPTION OF DRAWINGS

FIG. 9 illustrates a calibration procedure performed in the instrumentation system prior to measurement of return loss characteristics and coupling characteristics of the antenna device.

DESCRIPTION OF EMBODIMENTS

Figure 1A:
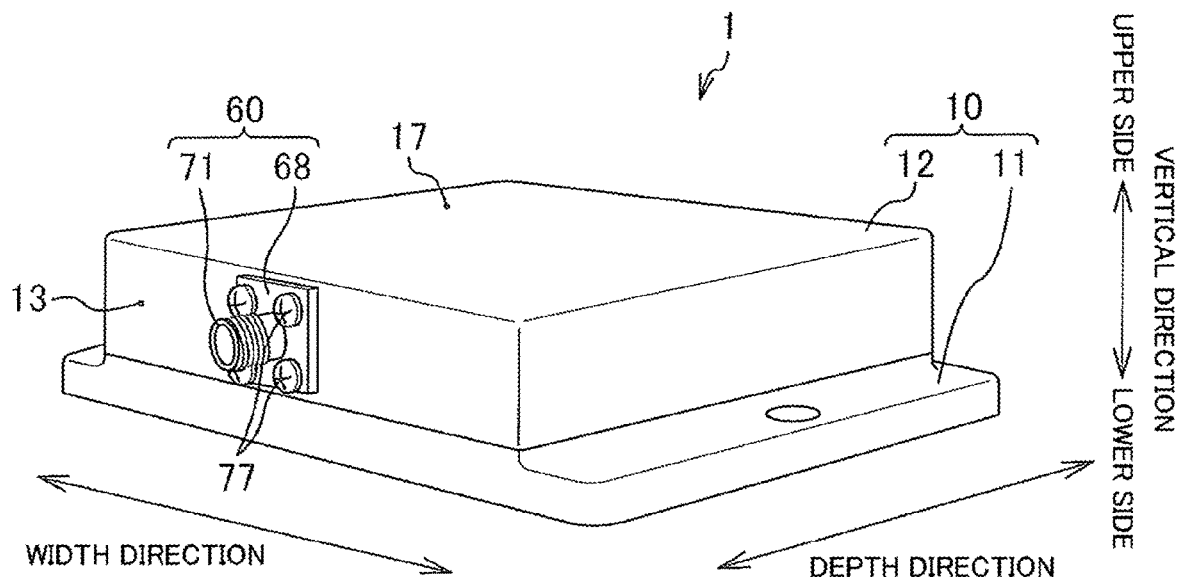
FIGS. 1(a) and (b) are perspective views respectively illustrating an appearance of an antenna device according to a first embodiment of the present invention.
Figure 1B:
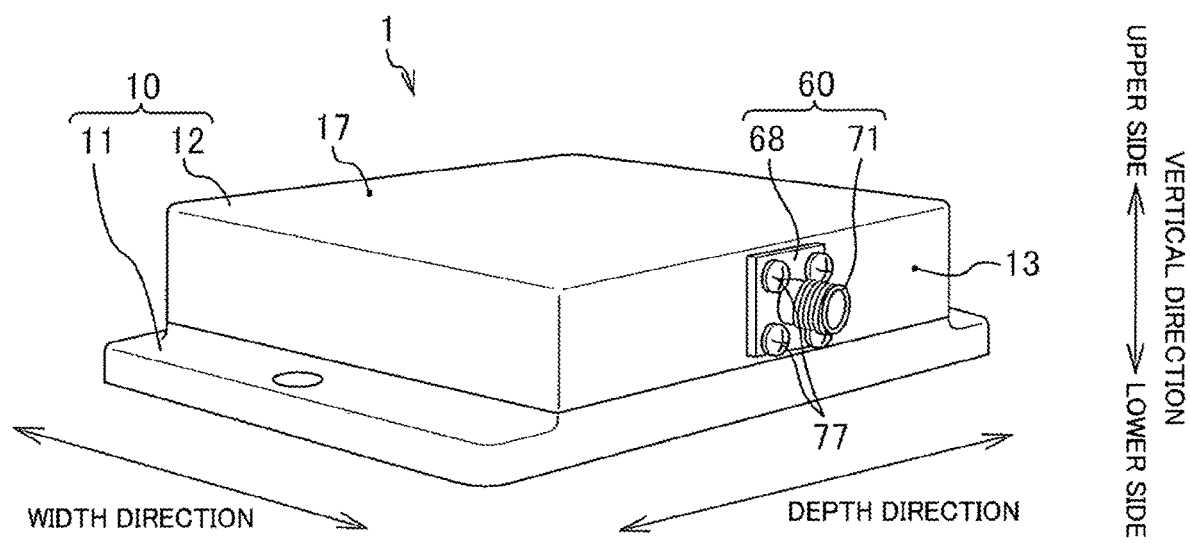

The present invention will be described below in detail with an embodiment illustrated in the drawings. Constituent elements, types, combinations, shapes, and relative arrangements described in the embodiment are merely explanatory examples, and are not intended to limit the scope of the present invention solely thereto unless otherwise specified.

[First Embodiment: Normal Model]

Figure 2:
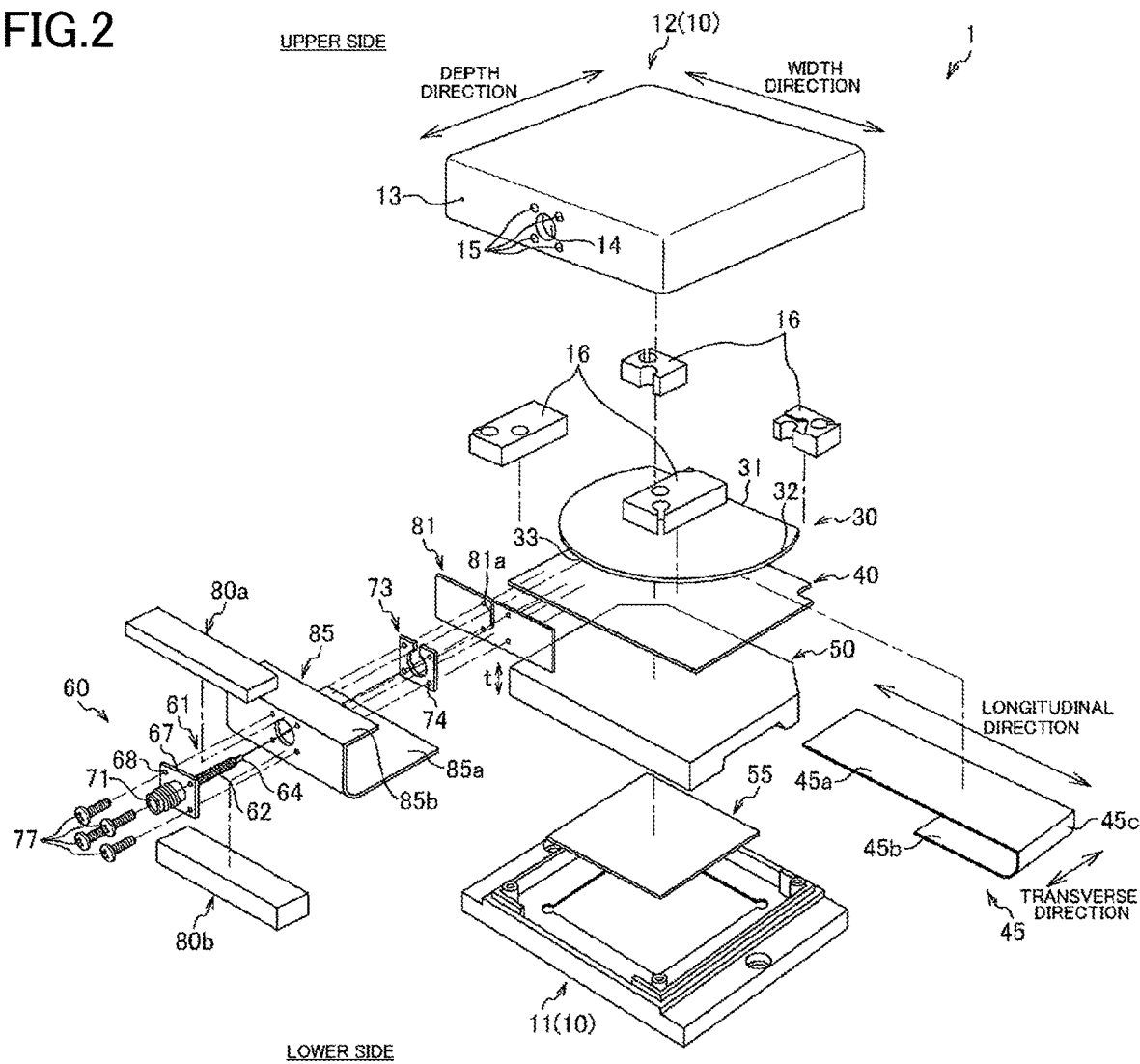
FIG. 2 is an exploded perspective view of the antenna device according to the first embodiment of the present invention.
Figure 3:
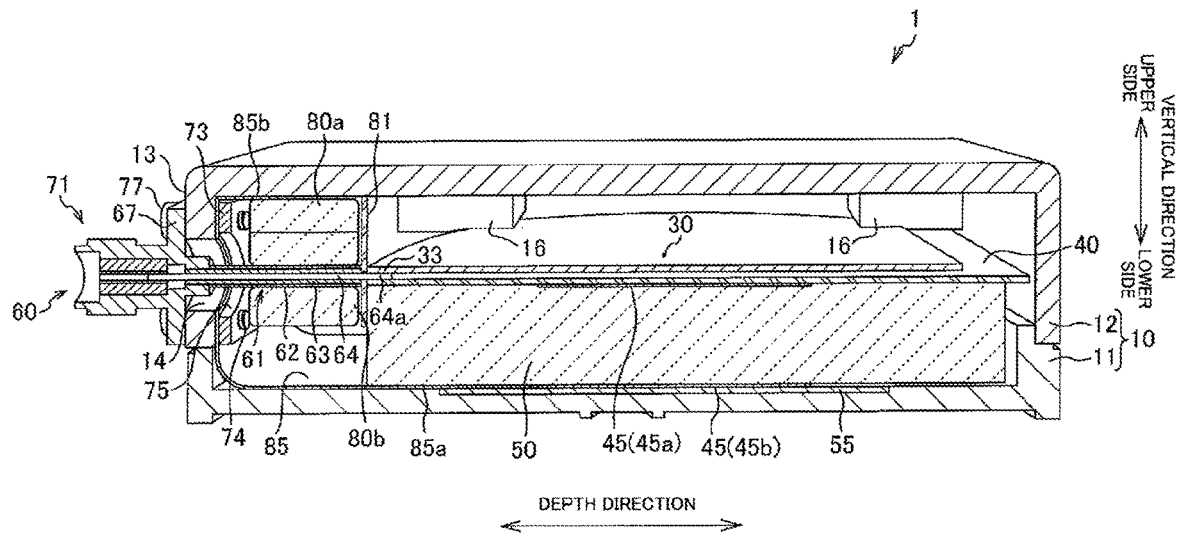
FIG. 3 is a perspective view illustrating a cross-section of the antenna device cut along a signal input member.
Figure 4:
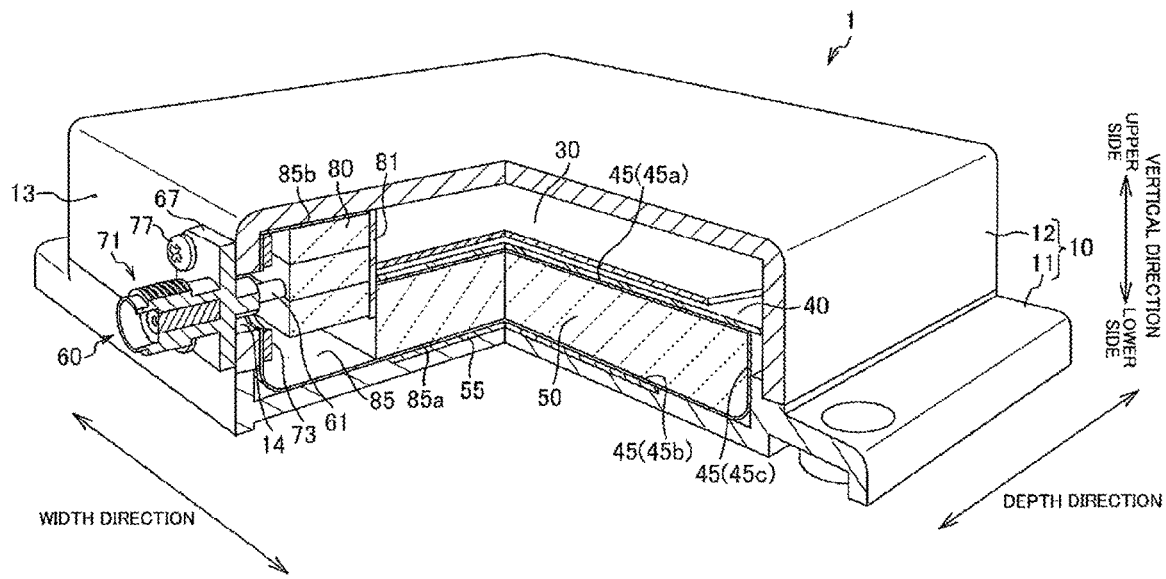
FIG. 4 is a perspective view illustrating a cross-section cut by a surface of the antenna device along the signal input member, and a surface orthogonal thereto.

FIGS. 1(a) and (b) are perspective views respectively illustrating an appearance of an antenna device according to a first embodiment of the present invention. FIG. 2 is an exploded perspective view of the antenna device according to the first embodiment of the present invention. FIG. 3 is a perspective view illustrating a cross-section of the antenna device cut along a signal input member. FIG. 4 is a perspective view illustrating a cross-section cut by a surface of the antenna device along the signal input member, and a surface orthogonal thereto.

The antenna device according to the present embodiment is characterized in that an insulator is inserted between an antenna element and a tuning plate.

In the following descriptions, it is assumed that the side from which electromagnetic waves are radiated is an upper side (upper surface) or a front side (front surface), and the opposite side is a lower side (lower surface) or a back side (rear surface). Further, it is assumed that an extending direction of a coaxial connector is a depth direction, and a direction orthogonal to a vertical direction and the depth direction is a width direction.

<Outline Around Antenna Element>

An antenna device 1 includes a case 10 that forms a hollow storage portion for storing respective constituent members, and the case 10 includes a base 11 having a substantially rectangular shape, and an upper cover 12 fixed to the base 11 by screws. On one side surface plate 13 extending in the width direction of the upper cover 12, a coaxial-member insertion hole 14 for inserting a signal input member 61 of a coaxial connector 60, and insertion holes 15 for fixing by screws the coaxial connector 60 to the side surface plate 13 are formed to penetrate therethrough.

An antenna element 30 having a semicircular plate shape (or an arcuate shape) is stored in the case 10. A first insulating plate 40 that insulates between the antenna element 30 and other members, a tuning plate 45 that functions as a short stub, a radio wave absorber 50 having a predetermined thickness t, and a tuning coated plate 55 are sequentially stacked on the lower side (the rear surface side) of the antenna element 30. A reference numeral 16 in the drawings is an element guide that performs positioning of the antenna element 30 in the case 10.

<Antenna Element>

Figure 5:
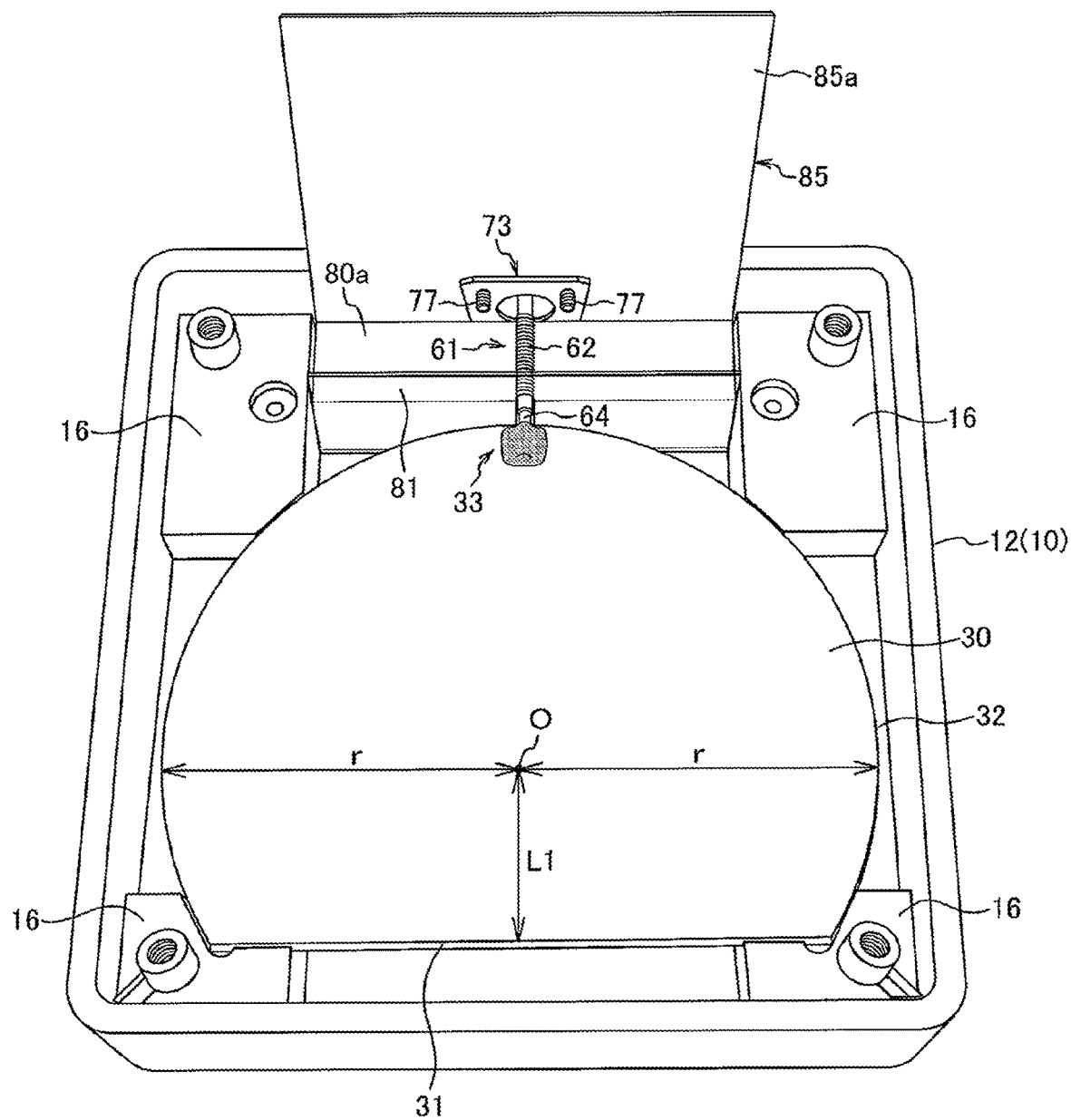
FIG. 5 is a perspective view of an antenna element assembled to the antenna device as observed from a rear surface side.

FIG. 5 is a perspective view of an antenna element assembled to the antenna device as observed from the rear surface side.

The antenna element 30 has a shape such that a smaller arcuate shaped portion of two arcuate shaped portions obtained when a circular copper plate is cut into two by one cord 31 is removed from the circular copper plate. The antenna element 30 includes a circular outer edge 32 in at least a part of its outer edge, and a power feeding unit 33 in a part of the circular outer edge 32. The antenna element 30 also includes the cord 31 that connects between end points of the circular outer edge 32 in the other part of the outer edge.

The antenna element 30 is configured by a copper plate having a thickness of 0.8 millimeter, and the size thereof is such that a radius r is 35 millimeters, and a distance L1 from a center O to the cord 31 is 19 millimeters. The length of the cord 31 is about 59 millimeters. A central angle (a central angle with respect to the circular outer edge 32) of the antenna element 30 is larger than 180 degrees, and is about 245 degrees. By forming the antenna element 30 in such a shape that the arcuate portion having a smaller central angle is removed from the circular copper plate, VSWR characteristics can be improved significantly as compared to a case in which the arcuate portion is not removed. Electromagnetic waves radiated from the antenna element 30 are linearly polarized waves.

The antenna element 30 has the power feeding unit 33 in an appropriate portion of the circular outer edge 32, more specifically, in a central portion of the circular outer edge 32.

The size of the antenna element 30 is decided, taking into consideration the influence of wavelength shortening due to a dielectric constant of the radio wave absorber. If the radio wave absorber is assumed to be made of polyurethane, and a wavelength shortening coefficient 0.45 at the time of the dielectric constant being 5 is reflected to λ/4 of 600 MHz, the shortened wavelength becomes 56 millimeters. Therefore, the initial shape is assumed to be a circle having a diameter of 56 millimeters. A diameter of the final circle is decided as 70 millimeters based on a result of experiments conducted by gradually increasing the diameter from the circle. Further, the arcuate shaped portion is removed in order to perform matching at around 600 MHz, to arrange a linear edge (the cord 31). As the size of the cord 31, the size of about 59 millimeters is adopted, since the size reflecting the shortening coefficient to λ/4 of approximately 600 MHz has the best characteristics from experiments.

<First Insulating Plate>

Referring back to FIG. 2, the first insulating plate 40 is configured by synthetic resin having an insulating property such as an acrylic plate and a polyvinyl chloride plate. The first insulating plate 40 has a function of insulation between the antenna element 30 and the radio wave absorber 50. The size of the first insulating plate 40 is set to a size capable of reliably maintaining an insulated state in which the antenna element 30 and the tuning plate 45 are not electrically connected.

<Tuning Plate>

The tuning plate 45 functions as a stub (a short stub) that performs impedance matching by being capacitively coupled with the antenna element 30 according to an opposing area to the antenna element 30.

The tuning plate 45 is arranged opposite to the rear surface side of the antenna element 30 in an insulated state. The tuning plate 45 is configured by a thin plate-like conductor having a length longer than a maximum diameter (maximum width) of the antenna element 30. Specifically, the tuning plate 45 is substantially in a band plate shape, and configured by brass foil (brass hammer foil, conductor) having a longitudinal length of 115 millimeters, a width of 25 millimeters, and a thickness of 0.05 millimeter.

A region of the tuning plate 45 facing the rear surface of the antenna element 30 via the first insulating plate 40 is a capacitive coupling portion 45a. An extra-length portion (45b, 45c) of the tuning plate 45 is folded back to the rear surface side of the radio wave absorber 50 via a side surface portion of the radio wave absorber 50. In the extra-length portion folded back to the rear surface side of the radio wave absorber 50, a grounding portion 45b that electrically connects to the tuning coated plate 55 is provided. The grounding portion 45b faces the rear surface of the radio wave absorber 50. A connecting portion 45c that connects the capacitive coupling portion 45a and the grounding portion 45b with each other is arranged therebetween.

The tuning plate 45 has such a configuration that the capacitive coupling portion 45a and the grounding portion 45b are each provided on the front surface side and the rear surface side of the radio wave absorber 50, by being deformed in a curved shape such as a J shape or a U shape, or folded back to a square U shape, to arrange the radio wave absorber 50 therebetween in the thickness direction. With this configuration, the capacitive coupling portion 45a faces the rear surface of the antenna element 30 via the first insulating plate 40, and the grounding portion 45b provided at the other end portion in the longitudinal direction directly faces the front surface of the tuning coated plate 55.

The capacitive coupling portion 45a is capacitively coupled with the antenna element 30. By variably changing the area of the capacitive coupling portion 45a, the capacitive coupling amount (tuning frequency, or resonance frequency) between the tuning plate 45 and the antenna element 30 can be adjusted.

In the present example, the capacitive coupling portion 45a faces the antenna element 30 over the whole area of the antenna element 30 in the width direction. In other words, the longitudinal length of the capacitive coupling portion 45a is set to have a length substantially same as the diameter of the antenna element 30 or longer. Therefore, the capacitive coupling amount with the antenna element 30 is adjusted by a transverse length (a length in the depth direction of the antenna device 1) of the capacitive coupling portion 45a.

Figure 17:
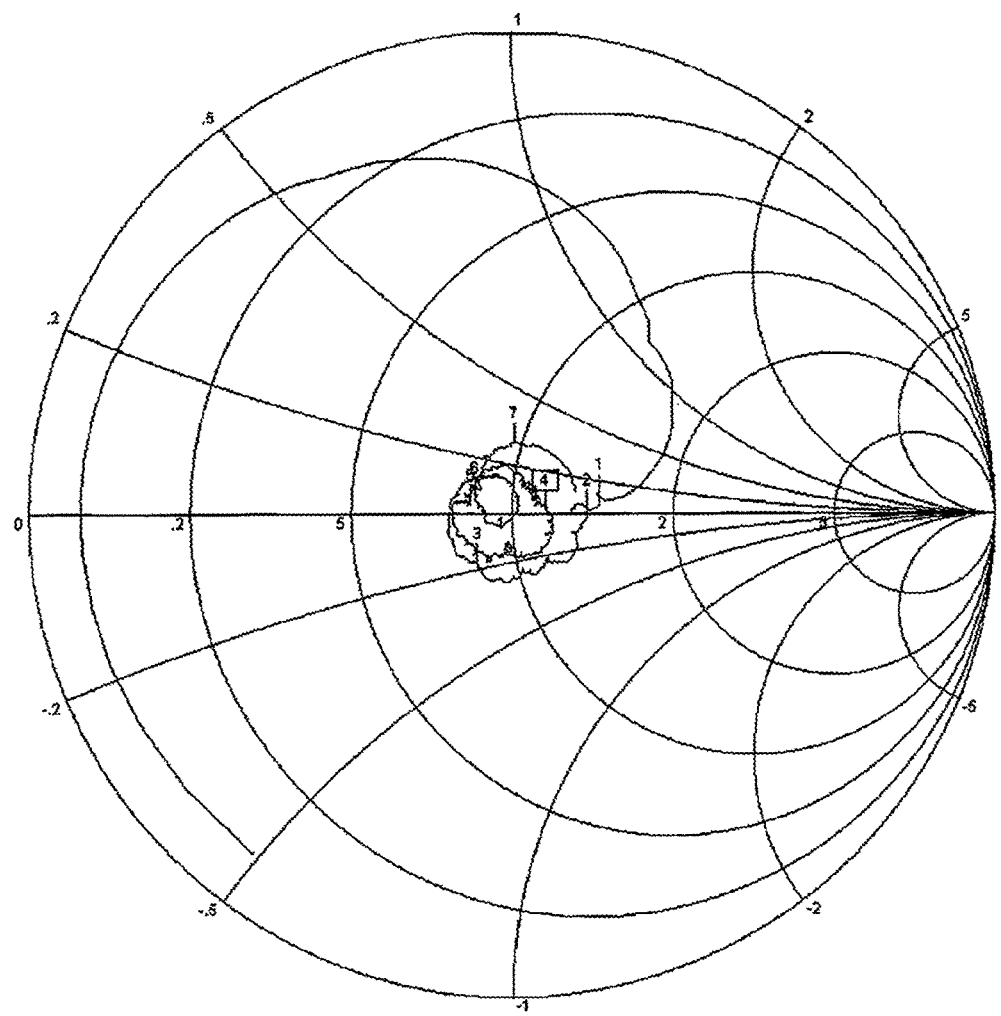
FIG. 17 is an impedance chart used for performing impedance matching of the antenna device.

When a coupling capacity C1 formed between the antenna element 30 and the capacitive coupling portion 45a, and an inductance L1 formed by the longitudinal length of the capacitive coupling portion 45a are to be adjusted respectively, impedance matching is performed with respect to a 50Ω coaxial cable, according to a well-known matching strategy method using an impedance chart (see FIG. 17).

For example, when a tuning frequency of the tuning plate 45 according to the present example is set to 1.3 GHz to 4.5 GHz, the longitudinal length of the tuning plate 45 can be set to 115 millimeters, the longitudinal length of the capacitive coupling portion 45a can be set to 74 millimeters, and the width length thereof can be set to 25 millimeters.

<Radio wave absorber>

The radio wave absorber 50 is arranged on the rear surface side of the capacitive coupling portion 45a of the tuning plate 45. The radio wave absorber 50 absorbs and attenuates radio waves radiated from the rear surface side of the antenna element 30.

The radio wave absorber 50 is configured by foamed polyurethane obtained by foaming dispersions of carbon powder. The radio wave absorber 50 has a size (an area) covering the entire surface of the antenna element 30. Radio-wave absorbing characteristics of the radio wave absorber 50 is decided by the thickness t thereof.

It suffices that the radio wave absorber 50 has a capability of absorbing radio waves in the entire frequency band accepted (that can be matched) by the antenna device 1. In the present example, ECCOSORB AN74 manufactured by E&C Engineering K.K. (thickness: 19 millimeters, corresponding frequency: 500 MHz to 9 GHz) can be adopted as the radio wave absorber 50.

The radio wave absorber 50 has a function of improving return loss characteristics of the antenna device 1 in the entire frequency band accepted (that can be matched) by the antenna device 1. Further, since the radio wave absorber 50 has a certain degree of elasticity, the radio wave absorber 50 is compressed in a vertical direction of the antenna device 1 at the time of assembly to have a function of preventing misregistration of respective members assembled in the case 10. For example, by compressing by about 2 millimeters the radio wave absorber 50 formed by foam having a thickness of about 20 millimeters and assembling the radio wave absorber 50 in the case 10, misregistration of other members assembled in the case 10 can be effectively prevented.

<Tuning Coated Plate>

The tuning coated plate 55 is arranged on the rear surface side of the radio wave absorber 50. A part of an upper surface of the tuning coated plate 55 comes in contact with the rear surface of the radio wave absorber 50 by directly facing each other, and another part thereof faces the rear surface of the radio wave absorber 50 via the grounding portion 45b of the tuning plate 45 and one end portion 85a in the longitudinal direction of a grounding plate (grounding member) 85 described later. The tuning coated plate 55 is electrically connected to the grounding portion 45b of the tuning plate 45 by means of surface contact therewith, and is electrically connected to the one end portion 85a in the longitudinal direction of the grounding plate 85 by means of surface contact therewith.

In the tuning coated plate 55, a metallic plating film is formed on an upper surface of a rectangular flat plate made of ABS resin, which is synthetic resin. The metallic plating film is a vacuum evaporated nickel-plated film. The tuning coated plate 55 has a square shape with one side being 48 millimeters and a thickness being 1 millimeter.

The tuning coated plate 55 is capacitively coupled with the antenna element 30 via the tuning plate 45, to have a function of tuning electromagnetic waves mainly in a relatively low frequency band from 600 MHz to 1.5 GHz. If the tuning coated plate 55 is arranged so that 85% or more of the area is located immediately below the antenna element 30, the above function can be achieved sufficiently, from experiment results.

The tuning coated plate 55 also has a function of shielding that prevents leakage of radio waves from the lower surface of the antenna device 1 to outside.

<Power Feed and Outline of Periphery of Grounding Portion>

A configuration of a signal input member and the periphery thereof that feeds power to the antenna element 30 and grounds respective units of the antenna device 1 is described.

The antenna device 1 includes the coaxial connector 60 having a signal input member 61 with a center conductor 64 being electrically and mechanically fixed to the power feeding unit 33 of the antenna element 30, conductive cushions 80 (80a, 80b) that are elastically deformable and that include a fabric conductor at least in an outer periphery (outer surface) thereof and hold an external conductor 62 of the signal input member 61 therebetween, and a grounding plate (grounding member) 85 electrically conducted with the external conductor 62 of the signal input member 61, with a part thereof coming in contact with the grounding portion 45b of the tuning plate 45.

A second insulating plate 81 that insulates between the conductive cushions 80 and the antenna element 30 is inserted therebetween. A slit 81a that allows the center conductor 64 of the signal input member 61 to pass therethrough from the side of the side surface plate 13 toward the antenna element 30 is formed in the second insulating plate 81 in a vertical direction.

<Coaxial Connector>

The coaxial connector 60 includes the signal input member 61 arranged at one end portion in an axial direction, a flange portion 67 arranged in an intermediate part in the axial direction so as to be electrically conducted with the external conductor 62 of the signal input member 61, and a connector portion 71 (a coaxial receptacle) arranged at the other end portion in the axial direction to be electrically conducted with respective conductors of the signal input member 61 and be detachably connected to a transmission cable.

The signal input member 61 is a semi-rigid coaxial member and is inserted into the case 10 via the coaxial-member insertion hole 14. The external conductor 62 of the signal input member 61 is configured by a seamless cylindrical body made of metal. In a hollow portion of the external conductor 62, the center conductor 64 is stored via an insulator 63 made of fluorine resin or polyimide. In the present example, the external conductor 62 of the signal input member 61 is made of copper, and the center conductor 64 is made of silver-coated copper-covered steel wire.

The axial one end portion 64a of the center conductor 64 protrudes outside beyond an axial one end edge of the external conductor 62. In other words, the external conductor 62 surrounds the center conductor 64 at the other end in the axial direction. The axial one end portion 64a of the center conductor 64 exposed outside is fixed by welding to the power feeding unit 33 provided on the rear surface of the antenna element 30. The axial direction of the signal input member 61 extends in a depth direction based on the antenna device 1, and extends in a direction along a tangent line of the circular outer edge 32 of the antenna element 30, that is, in a direction orthogonal to the cord 31.

Insertion holes 68 each for inserting the shaft of a screw 77 are formed to penetrate the flange portion 67 at appropriate places thereof. The flange portion 67 is fixed to the side surface plate 13 of the upper cover 12. A connector plate 73 having a screw hole 74 with a screw thread being formed is additionally provided on an inside surface of the side surface plate 13. Further, a cable insertion portion 75 for allowing passage therethrough of the signal input member 61 is formed at appropriate places on the surface of the connector plate 73. The flange portion 67 and the connector plate 73 are configured by a conductor made of iron or the like.

The coaxial connector 60 is fixed to the side surface plate 13 of the upper cover 12, by inserting the shaft of the screw 77 into each hole to screw the shaft into the screw hole 74, in a state in which the screw holes 74 in the connector plate 73 and the insertion holes 15 and 68 respectively formed in the side surface plate 13 and the flange portion 67 are made continuous with each other. Since the connector plate 73 is electrically conducted with the flange portion 67 via the conductive screws 77, the connector plate 73 is also electrically conducted with the external conductor 62 of the signal input member 61.

The connector portion 71 is a SMA (Sub Miniature Type A) 50Ω connector, and is detachably connected with the transmission cable, being a coaxial cable that transmits a high frequency signal. By connecting the transmission cable to the connector portion 71, an internal conductor of the transmission cable and the center conductor 64 of the signal input member 61 are electrically conducted with each other, and an external conductor of the transmission cable and the external conductor 62 of the signal input member 61 are electrically conducted with each other.

<Grounding Plate>

The grounding plate 85 is means for improving the VSWR (Voltage Standing Wave Ratio) characteristics in all the frequency bands (600 MHz to 6 GHz) accepted by the antenna device 1 according to the present embodiment.

The grounding plate 85 is substantially in a rectangular shape, and is configured by brass foil (brass hammer foil) having a thickness of 0.05 millimeters. The width length of the grounding plate 85 is same as the width length of the conductive cushion 80. The length of the grounding plate 85 in a direction orthogonal to the width direction (longitudinal length) is set to a length such that the grounding plate 85 can ground the conductive cushion 80, the tuning coated plate 55, and the tuning plate 45 directly or indirectly.

The grounding plate 85 is arranged in such a manner that a part thereof (in the present example, an intermediate part in the longitudinal direction) is arranged between the inside surface of the side surface plate 13 and the connector plate 73, and the position thereof is fixed in the case 10 by being co-fastened to the connector plate 73 together with the side surface plate 13 and the flange portion 67 by the screws 77. Further, the grounding plate 85 is electrically conducted with the external conductor 62 of the signal input member 61 via the screws 77, by being arranged close to the connector plate 73. At the time of assembly, since an appropriate place of the grounding plate 85 in the longitudinal direction is bent or deformed in a curved shape, the grounding plate 85 is arranged in the case 10 in a posture deformed substantially in a J shape, an L shape, a U shape, or a square U shape. In the present example, the one end portion 85a in the longitudinal direction of the grounding plate 85 comes in surface contact with the surface of the tuning coated plate 55 and an appropriate place of the grounding portion 45b of the tuning plate 45, and the other end portion 85b in the longitudinal direction comes in surface contact with the conductive cushion 80 to ground the respective members.

The other end portion 85b in the longitudinal direction has a length set so as not to protrude to the side of the antenna element 30 beyond the second insulating plate 81. That is, the grounding plate 85 does not face the upper surface of the antenna element 30.

<Conductive Cushion>

The conductive cushions 80 (80a, 80b) hold the external conductor 62 of the signal input member 61 by vertically arranging the external conductor 62 therebetween, thereby being electrically conducted with the external conductor 62. Further, the conductive cushions 80 are pressed by the external conductor 62 and deformed, thereby having a function of stabilizing the vertical position of the signal input member 61 inside the antenna device 1.

The conductive cushion 80 is formed by integrating a conductive fabric material on an outer periphery of a core material, which is elastically deformable foam. It is desired that the foam is configured by an insulator such as foamed polyurethane, foamed chloroprene rubber, rubber sponge, or the like. It is permissible to use a conductive urethane worm or the like as the foam. The conductive fabric material is a meshed conductor formed by weaving or knitting, for example, metallic fiber and can be mesh-formed from, for example, a metallic wire material obtained by nickel-plating copper. The conductive fabric material may be non-woven fabric.

The conductive cushion 80 is arranged so that the longitudinal direction thereof extends in a direction intersecting (a direction substantially orthogonal) the axial direction of the signal input member 61, that is, in the width direction of the antenna device 1. The tuning frequency of the conductive cushions 80 may be adjusted by the length of the conductive cushion 80 in the width direction of the antenna device 1.

When a coupling capacity C2 formed between the conductive cushion 80 and the grounding plate 85, and an inductance L2 formed by the length of the conductive cushion 80 are to be respectively adjusted, impedance matching is performed with respect to the 50Ω coaxial cable according to a well-known matching strategy method using the impedance chart (see FIG. 17).

For example, the conductive cushion 80a arranged on the upper side of the signal input member 61 may have "thickness (vertical length) of 4 millimeters× width (length in depth direction) of 10 millimeters× length of 45 millimeters". The conductive cushion 80b arranged on the lower side of the signal input member 61 may have "thickness of 8 millimeters× width of 10 millimeters× length of 45 millimeters". In the present example, the tuning frequency of the conductive cushion 80 is 4.5 GHz to 6 GHz.

<Flow of Electricity>

When the antenna device 1 is in a reception state, radio waves coming in from outside are picked up by the antenna element 30 and guided to the connector portion 71 through the signal input member 61.

On the other hand, when the antenna device 1 is in a transmission state, radio waves supplied to the connector portion 71 are supplied to the antenna element 30 through the signal input member 61 and radio waves are radiated to the air.

<Effects>

As described above, according to the present embodiment, the antenna element 30 sufficiently large with respect to a wavelength, which is decided by taking into consideration wavelength shortening with respect to one fourth the wavelength (125 millimeters to 12.5 millimeters) of the frequency (600 MHz to 6 GHz) accepted (that can be matched) by the antenna device 1, is adopted, and a member that improves the return loss characteristics corresponding to each frequency band is attached. Specifically, the tuning coated plate 55 improves the return loss characteristics mainly in the 600 MHz to 1.5 GHz band, the tuning plate 45 improves the return loss characteristics mainly in the 1.3 GHz to 4.5 GHz band, and the conductive cushion 80 improves the return loss characteristics mainly in the 4.5 to 6 GHz band. Further, the radio wave absorber 50 improves the return loss characteristics in the 500 MHz to 9 GHz band.

In this manner, by attaching the members that improve the return loss characteristics corresponding to each frequency band, radio wave instrumentation in a wide range of frequency bands can be performed by one antenna device. Further, since the wavelength is shortened by achieving matching by using a dielectric constant, the antenna device can be downsized.

[Second Embodiment: NFC Model]

Figure 6A:
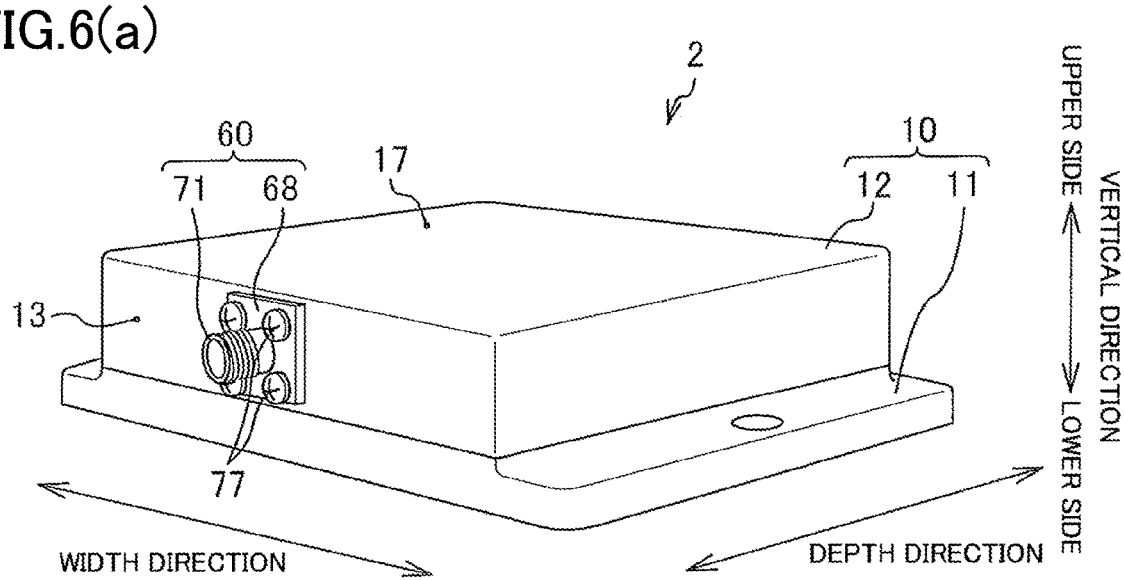
FIGS. 6(a) and (b) are perspective views respectively illustrating an appearance of an antenna device according to a second embodiment of the present invention.
Figure 6B:
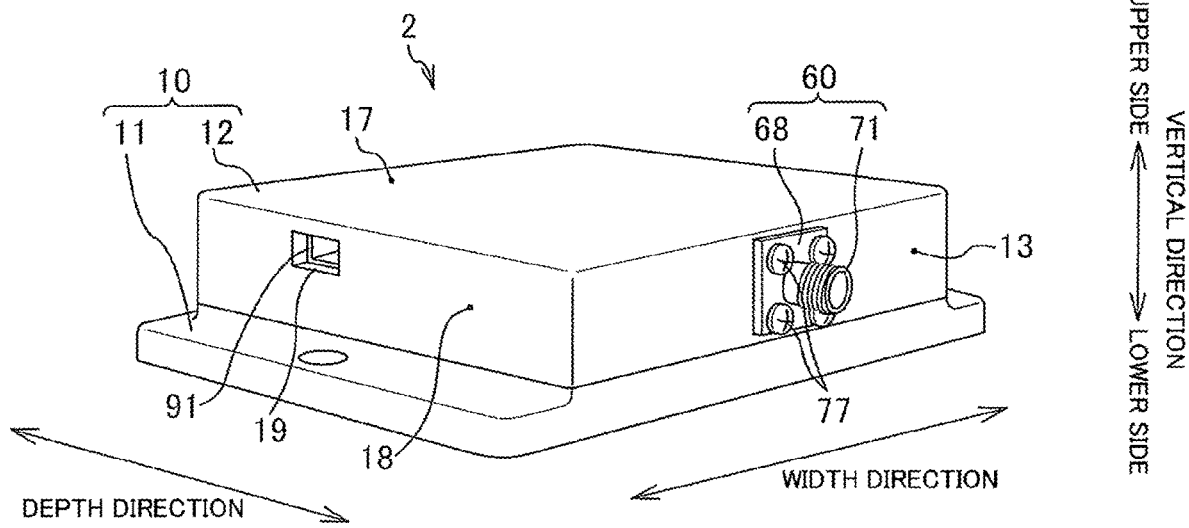
Figure 7:
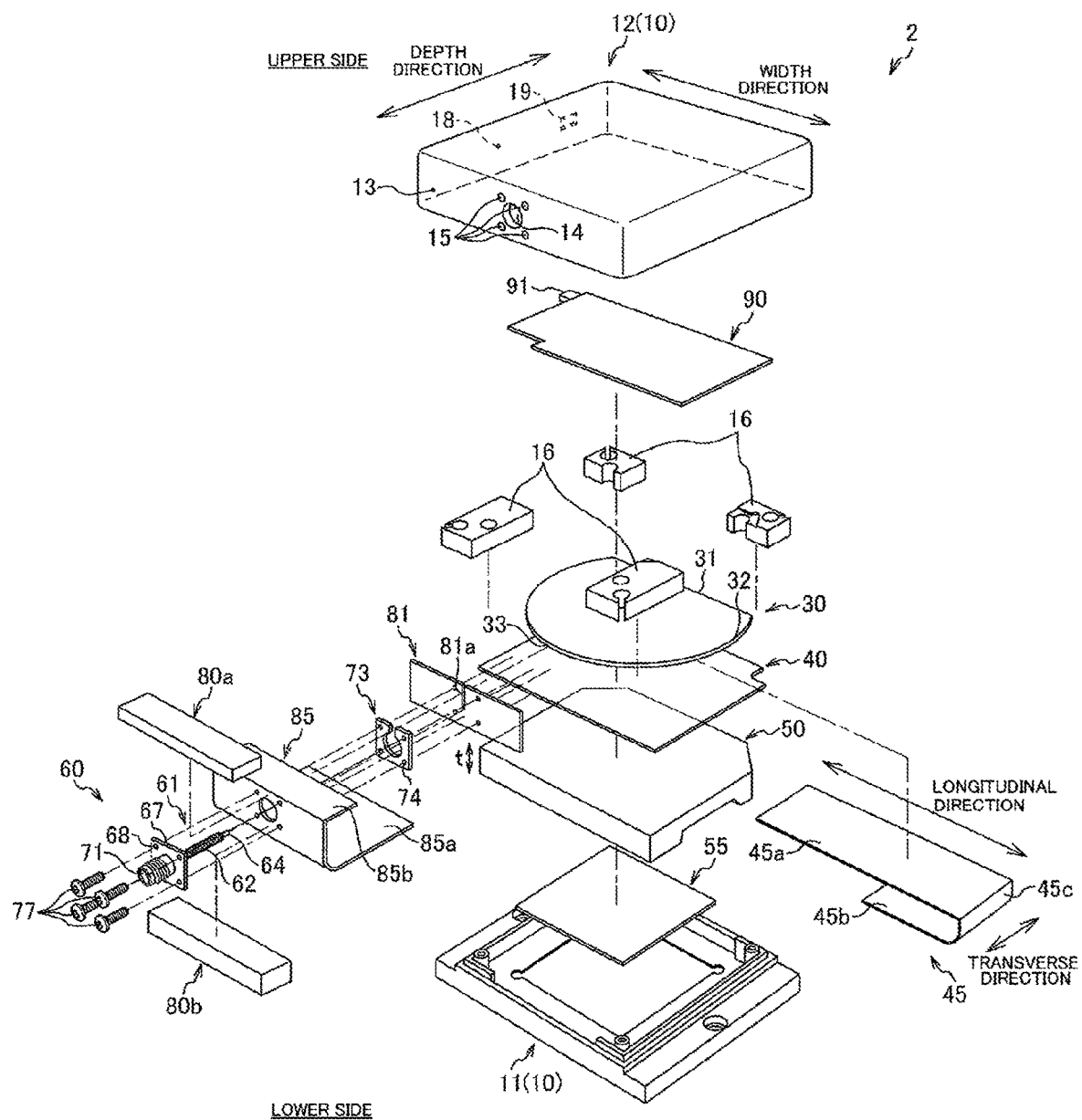
FIG. 7 is an exploded perspective view of the antenna device according to the second embodiment of the present invention.

FIGS. 6(a) and (b) are perspective views respectively illustrating an appearance of an antenna device according to a second embodiment of the present invention. FIG. 7 is an exploded perspective view of the antenna device according to the second embodiment of the present invention.

The antenna device according to the present embodiment is characterized in that an NFC board that performs wireless communication based on NFC (Near Field Communication) is provided. In the following descriptions, constituent elements identical to those of the first embodiment are denoted by like reference signs and descriptions thereof are omitted.

An antenna device 2 includes an NFC board 90 arranged above (on the surface side of) the antenna element 30. The NFC board 90 is stored in the case 10 in a non-contact state with the antenna element 30 being held between the element guide 16 and an upper surface plate 17 of the upper cover 12. The NFC board 90 includes a USB (Universal Serial Bus) terminal 91 as a connection terminal for wired communication in an appropriate place of an end edge. The USB terminal 91 is exposed to outside via a USB terminal hole 19 formed to penetrate a side surface plate 18 of the upper cover 12.

The NFC is a Near Field Communication standard of a communication distance of about 10 centimeters, which uses a frequency 13.56 MHz. That is, the NFC board 90 is a communication substrate that performs near field wireless communication in a frequency band different from the frequency band radiated by the antenna element 30. The NFC board 90 intervenes between an information processing device such as a personal computer that can be connected to the USB terminal 91 and a wireless communication terminal that can perform communication by NFC, to realize two-way communication between the information processing device and the wireless communication terminal. Here, the wireless communication terminal is a device that transmits and receives information wirelessly such as a mobile phone, a smartphone, or a Wi-Fi router, and is an object to be tested in a communication test in each frequency band (any frequency range included between 600 MHz and 6 GHz) by using the antenna device 2.

According to the present embodiment, when a communication test in each frequency band (any band in the range from 600 MHz to 6 GHz) is to be performed by using the antenna device 2, the information processing device can acquire a communication result from the wireless communication terminal by NFC, and it becomes possible to transmit a command to generate radio waves according to test contents from the information processing device to the wireless communication terminal by NFC.

[Explanations of Graphs]
<Antenna System and Instrumentation System>

Figure 8A:
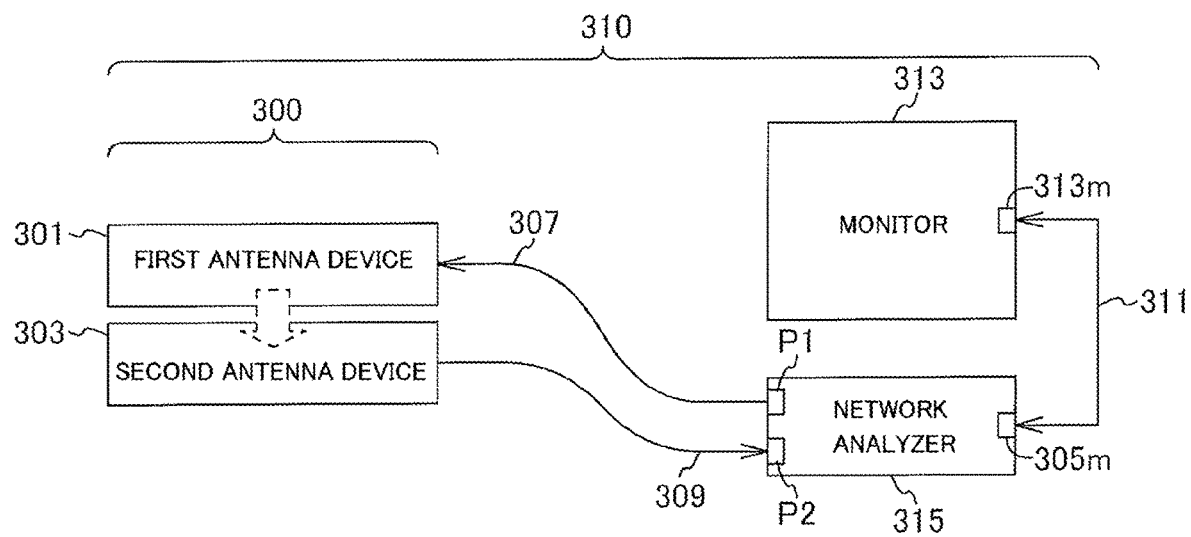
FIG. 8(a) is a block diagram illustrating an antenna system and an instrumentation system using the antenna device according to one embodiment of the present invention, and (b) is a perspective view illustrating a calibration kit used for calibration of the instrumentation system.
Figure 8B:
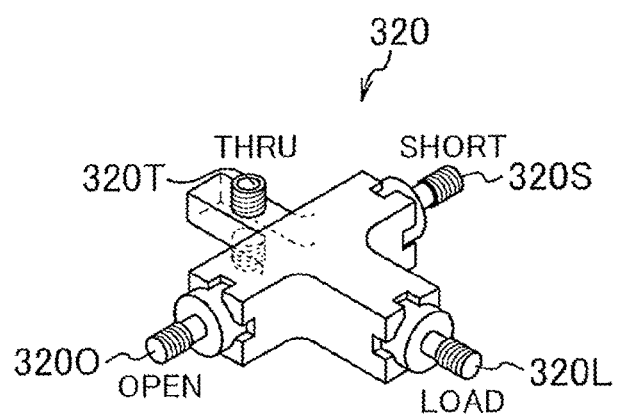

FIG. 8(a) is a block diagram illustrating an antenna system and an instrumentation system using the antenna device according to one embodiment of the present invention. FIG. 8(b) is a perspective view illustrating a calibration kit for calibration of the instrumentation system.

An antenna system 300 illustrated in FIG. 8(a) includes a pair of antenna devices, uses each antenna device as a first antenna device 301 and a second antenna device 303, and receives radio waves radiated from the first antenna device 301 by the second antenna device 303 arranged opposite to a radiation direction of the first antenna device 301.

An instrumentation system 310 includes a network analyzer 315 and a monitor 313, in which a coaxial cable 307 is connected to between a terminal P1 of the network analyzer 315 and a connector of the first antenna device 301, and a coaxial cable 309 is connected to between a terminal P2 and a connector of the second antenna device 303.

Further, a monitor cable 311 is connected to between a monitor terminal 305m of the network analyzer 315 and a terminal 313m of the monitor 313. For example, MS46322B manufactured by ANRITSU CORPORATION is used as the network analyzer 315.

The antenna device is arranged adjacent to (close to) an object to be measured, and is used for measuring, for example, radio waves radiated from the object to be measured. As the object to be measured, devices that generate electromagnetic waves such as a mobile phone and a mobile terminal is targeted, and a communication device (sub-6) that uses a frequency band of, for example, from 600 MHz to 6 GHz is targeted.

The instrumentation system 310 is suitable for measuring coupling characteristics and return loss characteristics between the first antenna device 301 and the second antenna device 303 provided in the antenna system 300.

In this manner, the antenna device 1 is arranged at a desired position with respect to an object to be measured or arranged close to the object to be measured, to receive radio waves radiated from the object to be measured.

Furthermore, by arranging an object to be measured between the first antenna device 301 and the second antenna device 303, when radio waves radiated from the object to be measured are received, or when radio waves are received by the object to be measured, the influence degree by the object to be measured can be measured.

In the instrumentation system 310 illustrated in FIG. 8(a), the calibration kit 320 illustrated in FIG. 8(b) is used for calibration.

The calibration kit 320 includes four connectors of a connector 320S (SHORT), a connector 320o (OPEN), a connector 320L (LOAD), and a connector 320T (THRU). For example, TOSLKF50A-40 manufactured by ANRITSU CORPORATION is used as the calibration kit 320.

<Calibration Procedure By Instrumentation System>

Figure 9:
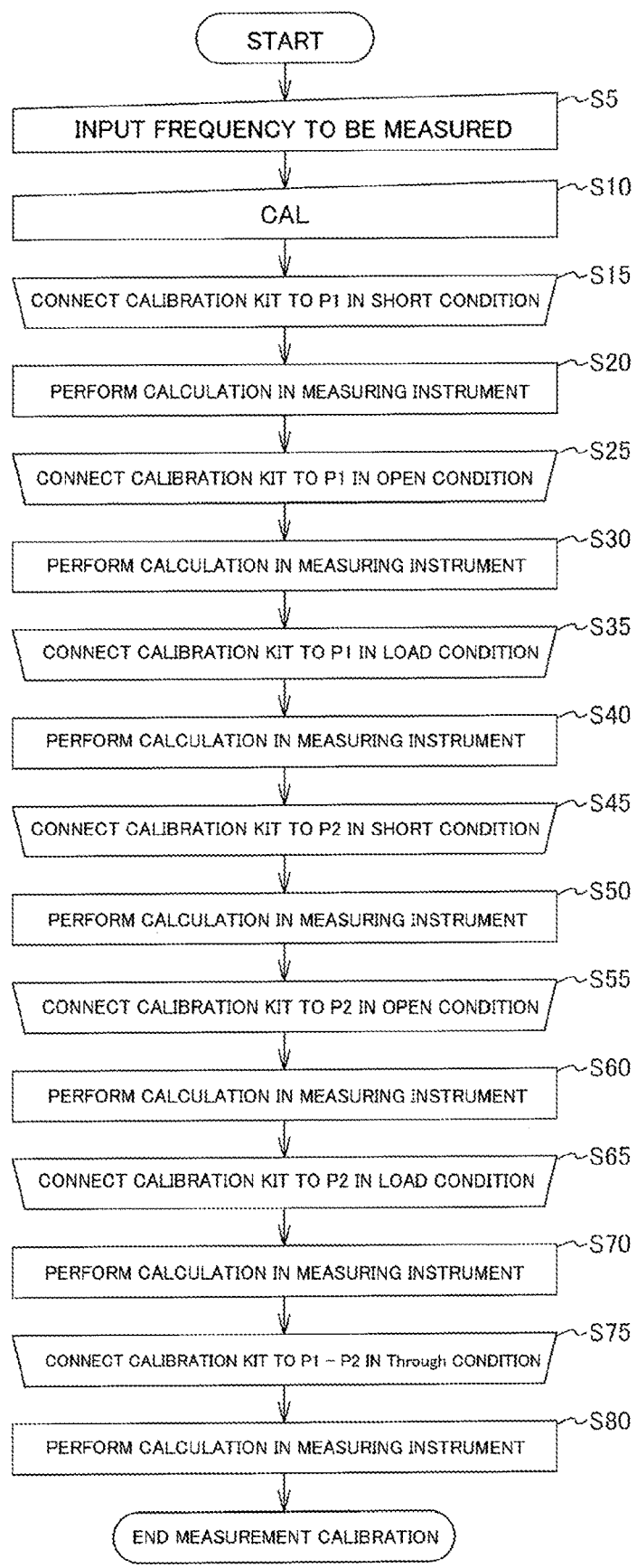
FIG. 9 is a flowchart illustrating a calibration procedure by the instrumentation system illustrated in FIG. 8. Specifically.

FIG. 9 is a flowchart illustrating a calibration procedure by the instrumentation system illustrated in FIG. 8. Specifically, a calibration procedure performed in the instrumentation system 310 prior to measurement of return loss characteristics and coupling characteristics of the antenna device 1 is illustrated.

At step S5, a frequency to be measured (for example, 500 MHz to 6.2 GHz) is input to the network analyzer 315.

At step S10, the network analyzer 315 is set to a calibration CAL mode.

At step S15, the connector 320S of the calibration kit is connected to an end of the coaxial cable 307, which is connected to the terminal P1 of the network analyzer 315, to set the end of the coaxial cable 307 to a short circuit condition (SHORT).

At step S20, the network analyzer 315 performs calculation in a measuring instrument in response to an operation of a user.

At step S25, the connector 320o of the calibration kit is connected to the end of the coaxial cable 307, which is connected to the terminal P1 of the network analyzer 315, to set the end of the coaxial cable 307 to an open condition (OPEN).

At step S30, the network analyzer 315 performs calculation in the measuring instrument in response to an operation of the user.

At step S35, the connector 320L of the calibration kit is connected to the end of the coaxial cable 307, which is connected to the terminal P1 of the network analyzer 315, to set the end of the coaxial cable 307 to a load condition (LOAD) in which a load (for example, 50Ω) is connected to the end of the coaxial cable 307.

At step S40, the network analyzer 315 performs calculation in the measuring instrument in response to an operation of the user.

At step S45, the connector 320S of the calibration kit is connected to an end of the coaxial cable 309, which is connected to the terminal P2 of the network analyzer 315, to set the end of the coaxial cable 309 to a short circuit condition (SHORT).

At step S50, the network analyzer 315 performs calculation in the measuring instrument in response to an operation of the user.

At step S55, the connector 320o of the calibration kit is connected to the end of the coaxial cable 309, which is connected to the terminal P2 of the network analyzer 315, to set the end of the coaxial cable 309 to an open condition (OPEN).

At step S60, the network analyzer 315 performs calculation in the measuring instrument in response to an operation of the user.

At step S65, the connector 320L of the calibration kit is connected to the end of the coaxial cable 309, which is connected to the terminal P2 of the network analyzer 315, to set the end of the coaxial cable 309 to a load condition (LOAD) in which a load (for example, 50 0) is connected to the end of the coaxial cable 309.

At step S70, the network analyzer 315 performs calculation in the measuring instrument in response to an operation of the user.

At step S75, the connector 320T of the calibration kit is connected to the ends of the coaxial cables 307 and 309, which are connected respectively to the terminals P1 and P2 of the network analyzer 315, to set between the ends of the coaxial cables 307 and 309 to a through condition (THRU).

At step S80, the network analyzer 315 performs calculation in the measuring instrument in response to an operation of the user.

As a result, amplitude characteristics, return loss characteristics, phase characteristics, and the like can be calibrated to a flat condition in a set frequency band, with respect to the instrumentation system including the network analyzer 315, and the coaxial cables 307 and 309.

<Return Loss Measurement Procedure>

Figure 10:
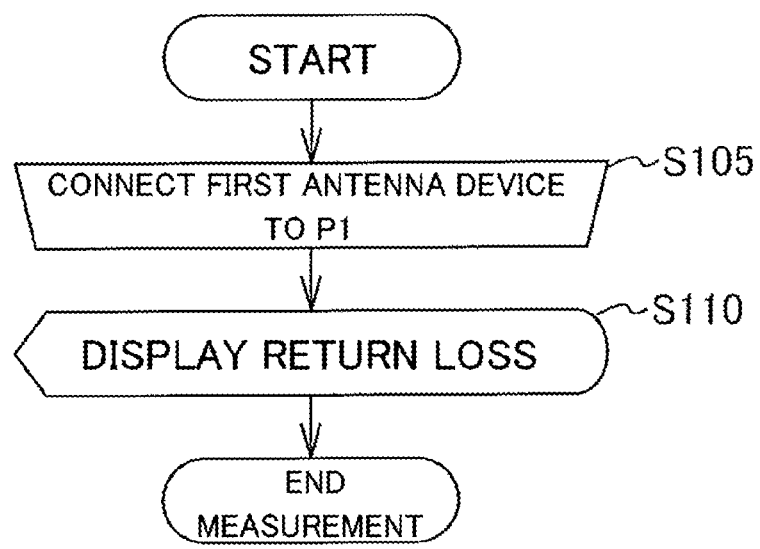
FIG. 10 is a flowchart illustrating a return loss measurement procedure performed in the instrumentation system illustrated in FIG. 8.

FIG. 10 is a flowchart illustrating a return loss measurement procedure performed in the instrumentation system illustrated in FIG. 8.

At step S105, the connector of the first antenna device 301 is connected to the end of the coaxial cable 307, which is connected to the terminal P1 of the network analyzer 315, to set the end of the coaxial cable 307 to a measurable condition.

At step S110, the network analyzer 315 performs calculation in the measuring instrument in response to an operation of the user, and displays a return loss on the monitor 313. At this time, power during sweeping in a frequency band output from the terminal P1 of the network analyzer 315 is reflected by the first antenna device 301, and power returned from the first antenna device 301 is measured.

<Measurement Procedure of Coupling Loss Characteristics>

Figure 11:
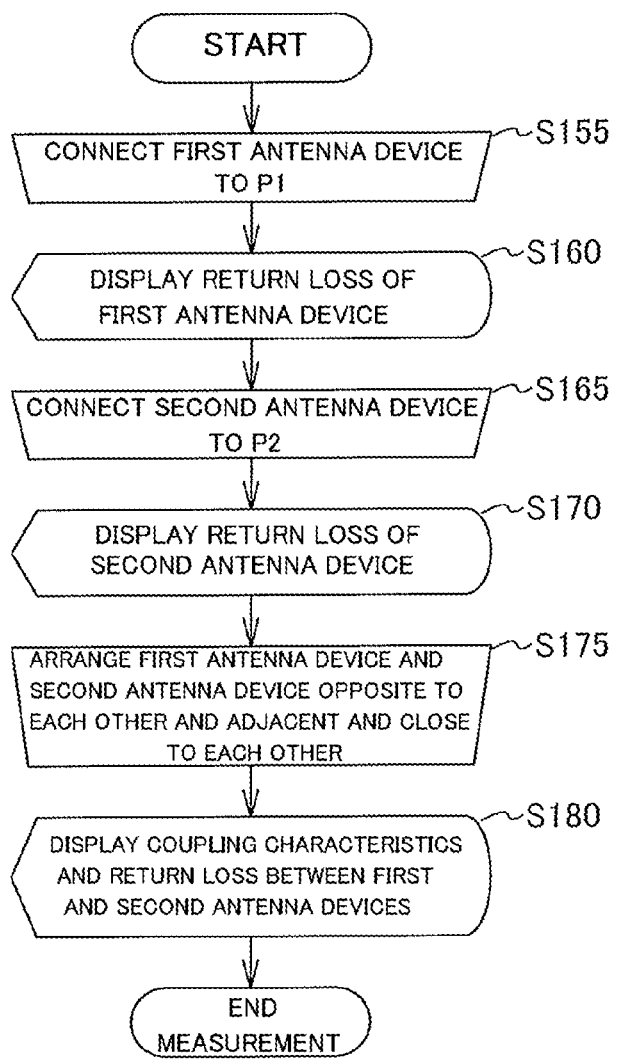
FIG. 11 is a flowchart illustrating a measurement procedure of coupling loss characteristics, performed in the instrumentation system illustrated in FIG. 8.

FIG. 11 is a flowchart illustrating a measurement procedure of coupling loss characteristics, performed in the instrumentation system illustrated in FIG. 8.

At step S155, the connector of the first antenna device 301 is connected to the end of the coaxial cable 307, which is connected to the terminal P1 of the network analyzer 315, to set the end of the coaxial cable 307 to a measurable condition.

At step S160, the network analyzer 315 performs calculation in the measuring instrument and displays a return loss of the first antenna device 301 on the monitor 313.

At step S165, the connector of the second antenna device 303 is connected to the end of the coaxial cable 309, which is connected to the terminal P2 of the network analyzer 315, to set the end of the coaxial cable 309 to a measurable condition.

At step S170, the network analyzer 315 performs calculation in the measuring instrument and displays a return loss of the second antenna device 303 on the monitor 313.

At step S175, the first antenna device 301 and the second antenna device 303 are arranged opposite to each other and adjacent to (close to) each other.

At step S180, the network analyzer 315 performs calculation in the measuring instrument and displays coupling characteristics and a return loss between the first antenna device 301 and the second antenna device 303 on the monitor 313.

<Standard Characteristics of Normal Model>

Figure 12:
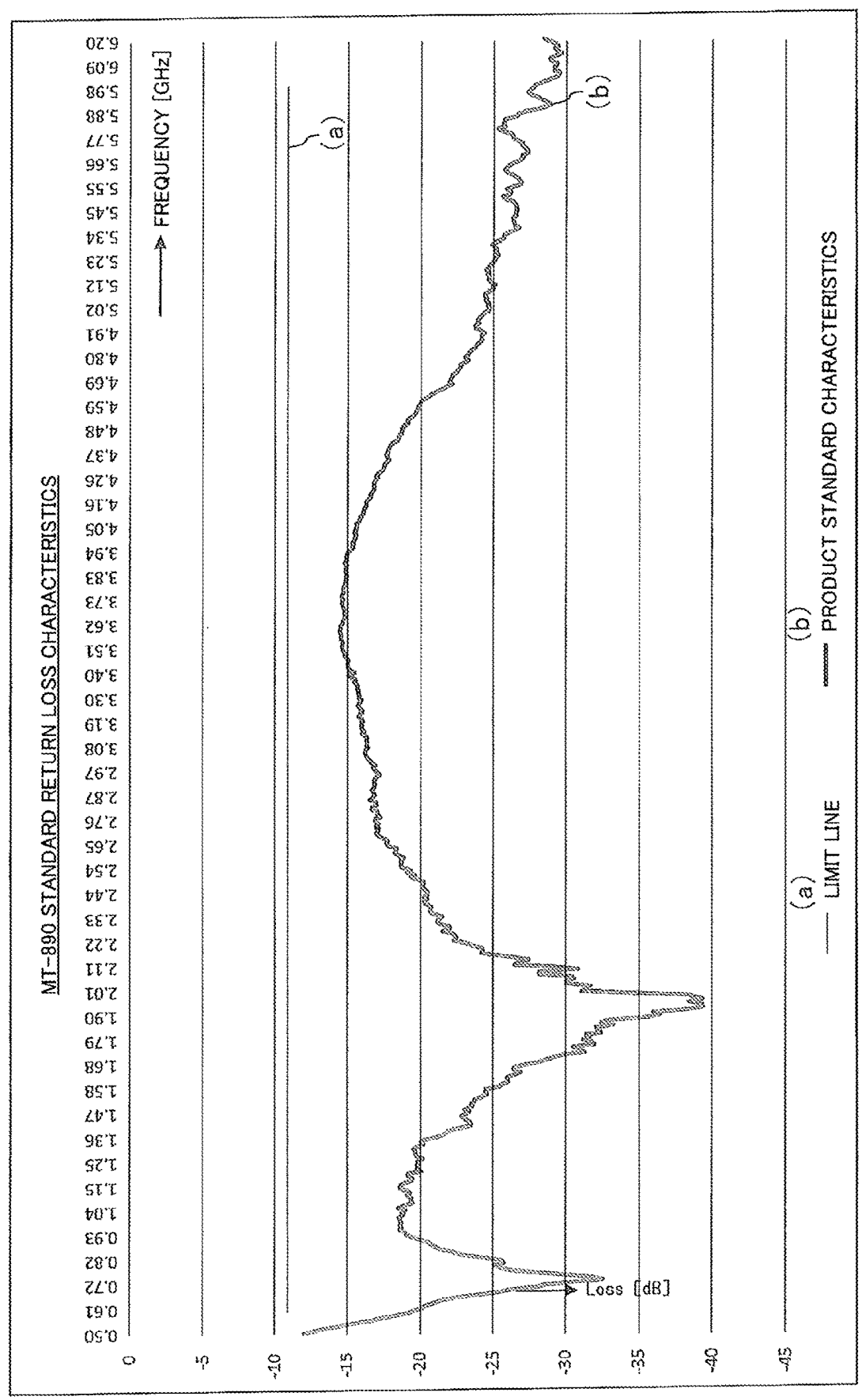
FIG. 12 is a graph illustrating standard characteristics of a return loss when a first antenna device configured in the first embodiment is a normal model.

FIG. 12 is a graph illustrating standard characteristics of a return loss when the first antenna device 301 configured in the first embodiment is a normal model.

In FIG. 12, (a) illustrates a limit line indicating −10.9 dB, and (b) illustrates standard characteristics of the first antenna device 301.

When the first antenna device 301 is a normal model, the first antenna device 301 indicates characteristics such that the return loss is −10.9 dB or more (in the case of VSWR, 1.8 or less) in the frequency band from 600 MHz to 6 GHz.

<Standard Characteristics of NFC Model>

Figure 13:
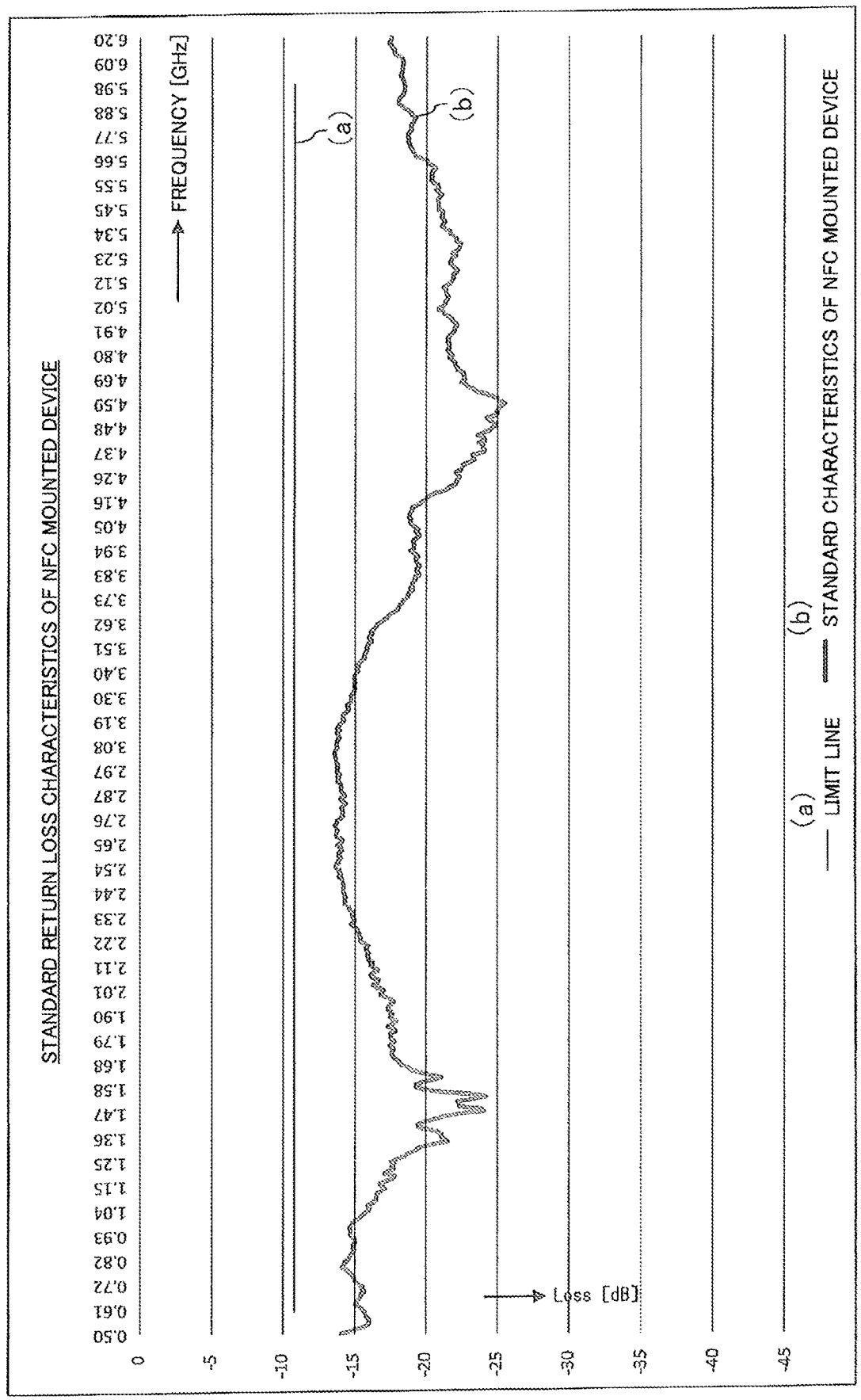
FIG. 13 is a graph illustrating standard characteristics of a return loss when the first antenna device configured in the second embodiment is an NFC model.

FIG. 13 is a graph illustrating standard characteristics of a return loss when the first antenna device 301 configured in the second embodiment is an NFC model.

In FIG. 13, (a) illustrates a limit line indicating −10.9 dB, and (b) illustrates standard characteristics of the first antenna device 301.

When the first antenna device 301 is an NFC model, since the NFC board 90 is configured by a double-sided board having a predetermined area, the first antenna device 301 affects the return loss in the frequency band from 600 MHz to 6 GHz.

However, as illustrated by (b), characteristics such that the return loss is −10.9 dB or more (in the case of VSWR, 1.8 or less) in the frequency band from 600 MHz to 6 GHz is indicated.

<Effect of Tuning Plate>

Figure 14:
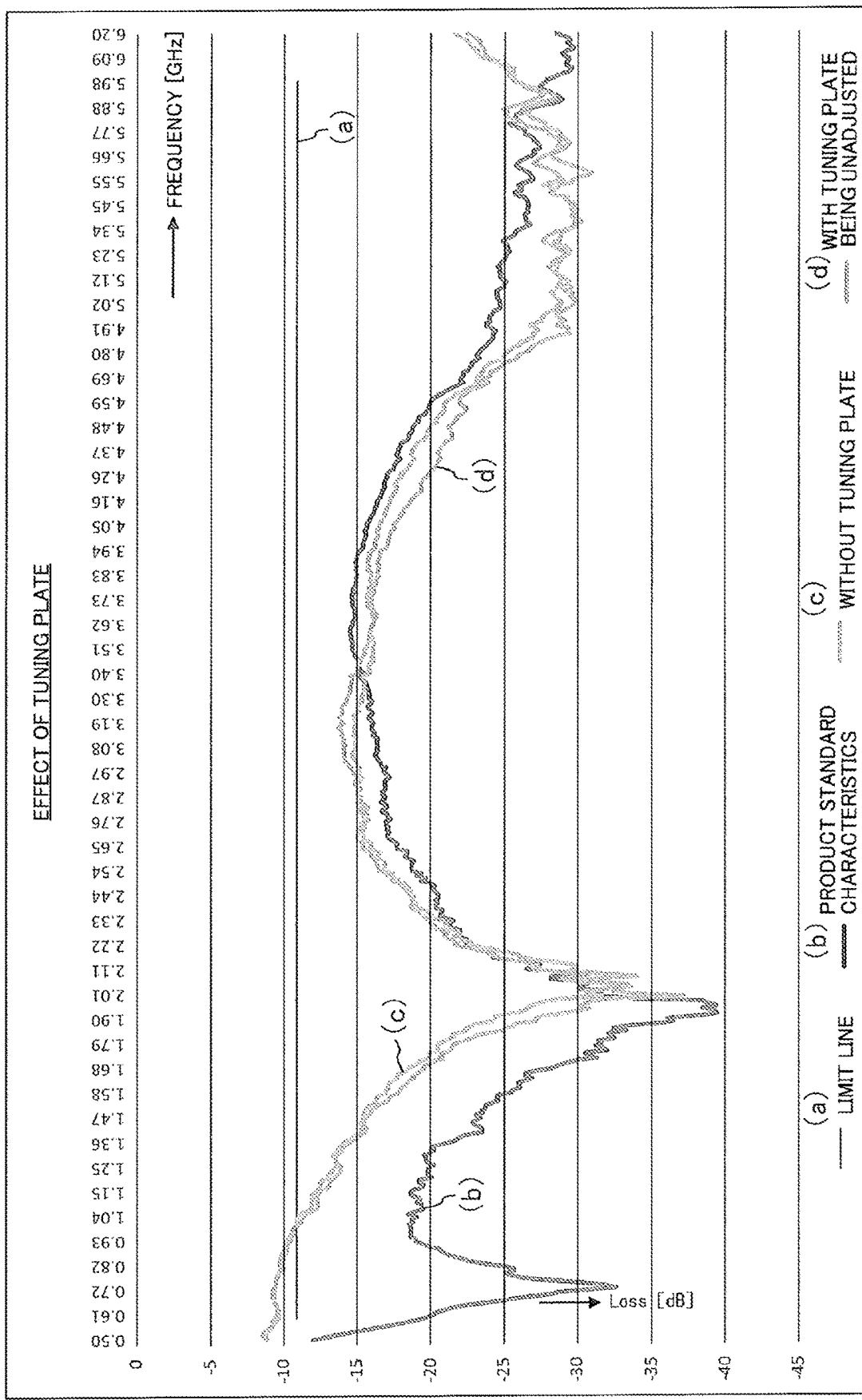
FIG. 14 is a graph illustrating comparative characteristics representing an effect of a tuning plate of the first antenna device.

FIG. 14 is a graph illustrating comparative characteristics representing an effect of the tuning plate of the first antenna device 301.

In FIG. 14, (a) illustrates a limit line indicating −10.9 dB, (b) illustrates standard characteristics of the first antenna device 301 (with the tuning plate 45), (c) illustrates characteristics without the tuning plate 45, and (d) illustrates characteristics when the tuning plate 45 is unadjusted.

In the characteristics (c) without the tuning plate, and the characteristics (d) when the tuning plate 45 is unadjusted, the limit line (a) of −10.9 dB is exceeded near 500 MHz to 1 GHz.

On the other hand, in the standard characteristics (b) in which the tuning plate 45 provided in the first antenna device 301 is adjusted (with the tuning plate 45), strong resonance of −35 dB to −39 dB occurs near 1.9 GHz.

<Effect of Tuning Coated Plate>

Figure 15:
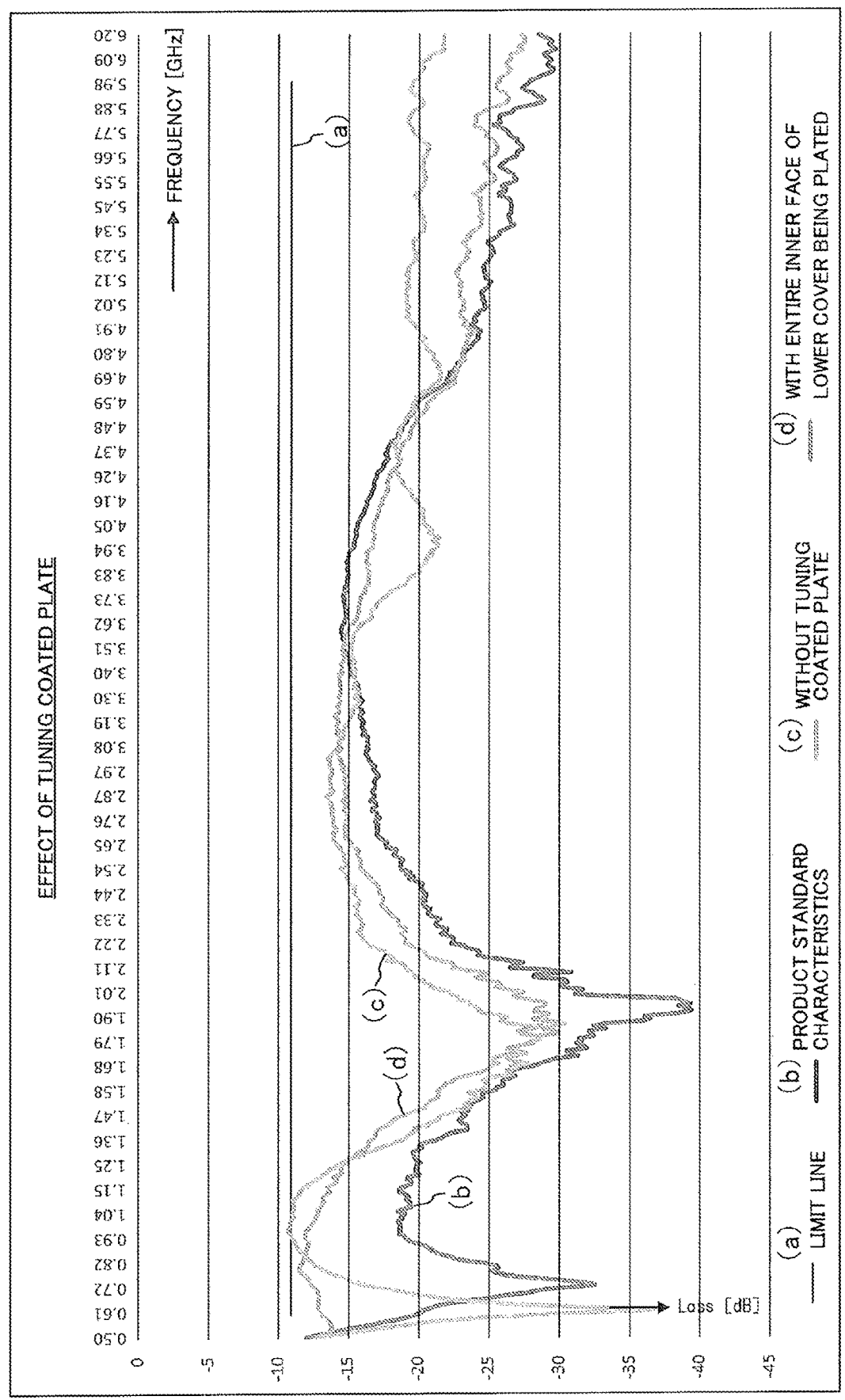
FIG. 15 is a graph illustrating comparative characteristics representing an effect of a tuning coated plate of the first antenna device.

FIG. 15 is a graph illustrating comparative characteristics representing an effect of the tuning coated plate of the first antenna device 301.

In FIG. 15, (a) illustrates a limit line indicating −10.9 dB, (b) illustrates standard characteristics of the first antenna device 301 (with the tuning coated plate 55), (c) illustrates characteristics without the tuning coated plate 55, and (d) illustrates characteristics when the entire inner face of the base 11 is plated.

In the characteristics (c) without the tuning coated plate 55, and the characteristics (d) when the tuning coated plate 55 is unadjusted, the characteristic line approaches the limit line (a) of −10.9 dB near 500 MHz to 1.2 GHz.

On the other hand, in the standard characteristics (b) in which the tuning coated plate 55 provided in the first antenna device 301 is adjusted (with the tuning coated plate 55), strong resonance of −35 dB to −39 dB occurs near 1.9 GHz.

<Effect of Conductive Cushion>

Figure 16:
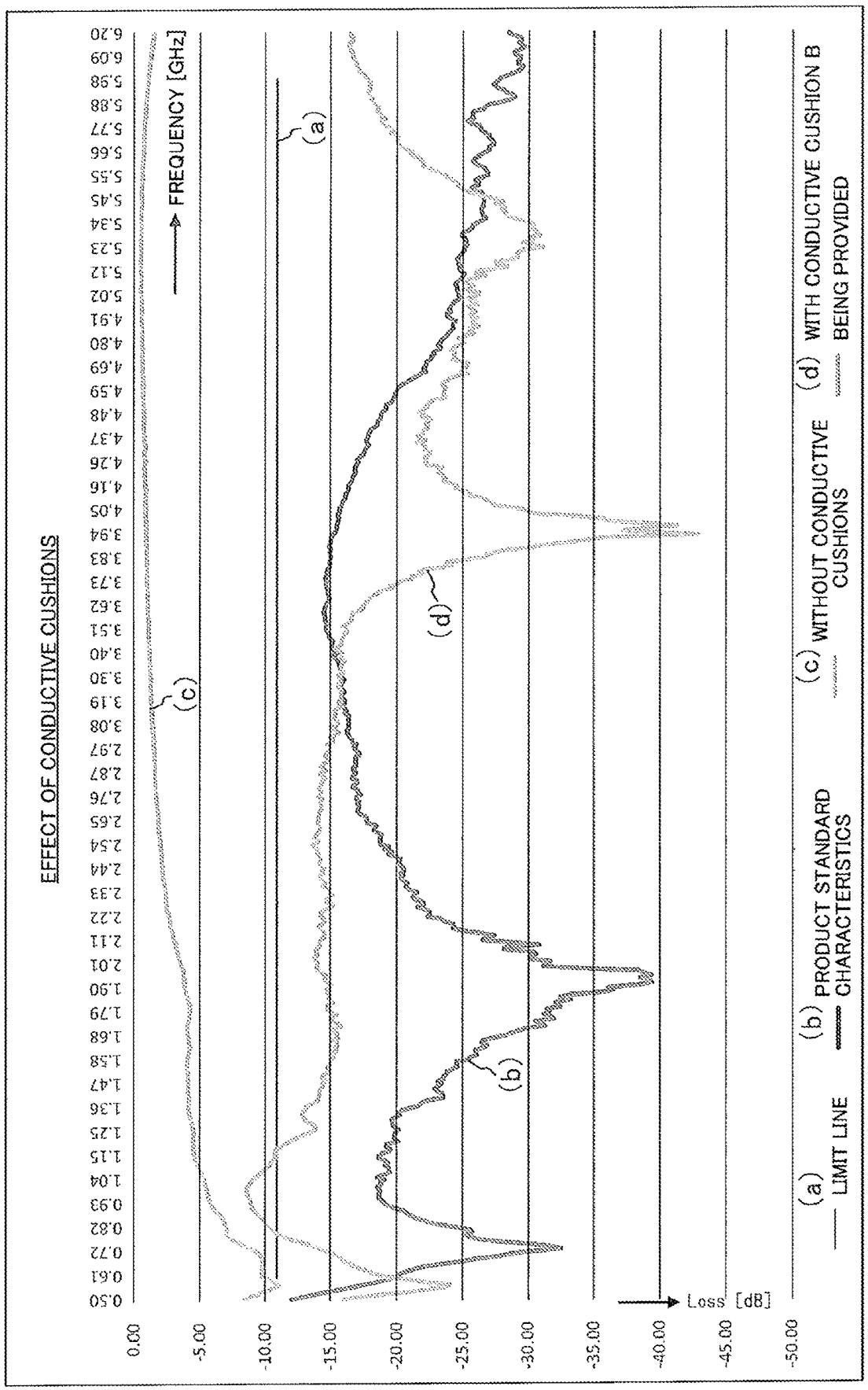
FIG. 16 is a graph illustrating comparative characteristics representing an effect of a conductive cushion of the first antenna device.

FIG. 16 is a graph illustrating comparative characteristics representing an effect of the conductive cushion of the first antenna device 301.

In FIG. 16, (a) illustrates a limit line indicating −10.9 dB, (b) illustrates standard characteristics of the first antenna device 301 (with the conductive cushion 80), (c) illustrates characteristics without the conductive cushion 80 with respect to the standard characteristics, and (d) illustrates characteristics when the conductive cushion 80 is provided.

In the characteristics (c) without the conductive cushion 80, the limit line (a) of −10.9 dB is exceeded near 500 MHz to 1.6 GHz.

In the characteristics (d) provided with the conductive cushion 80, the limit line (a) of −10.9 dB is exceeded near 700 MHz to 1.2 GHz, while strong resonance of −35 dB to −40-odd dB occurs near 3.8 GHz to 4 GHz.

On the other hand, in the standard characteristics (b) (with the conductive cushion 80) in which the conductive cushion 80 provided in the first antenna device 301 is adjusted, strong resonance of −35 dB to −39 dB occurs near 1.9 GHz to 2 GHz. Particularly, in (b), there is an effect of the conductive cushion 80 in a high frequency region of 6 GHz.

<Impedance Chart>

FIG. 17 is an impedance chart used for performing impedance matching of the antenna device 1.

The impedance chart is used for designing of impedance matching of RF (Radio Frequency) and microwaves, in which a real part (a resistance component) of an impedance Z is plotted on a horizontal axis and an imaginary part (a reactance component) is plotted on a vertical axis. The left end corresponds to Z=0 (total transmission), and the right end corresponds to Z=∞ (total reflectance). Further, the angles displayed in the periphery represents a phase θ (ANG: angle) of a voltage reflection coefficient. A center Z0 corresponds to a state in which a load and a transmission line are matched with each other, and is 50Ω normally. However, in the impedance chart, normalization is performed based on input impedance and the center Z0 is represented by 1.0.

[Summary of Action and Effects of Aspects of Present Invention]

<First Aspect>

The antenna device 1 according to the present aspect includes the antenna element 30 including the circular outer edge 32 in at least a part of an outer edge and the power feeding unit 33 in a part of the circular outer edge, the tuning plate 45 arranged opposite to a rear surface side of the antenna element in an insulated state, and configured by a thin plate-like conductor having a length longer than a maximum diameter of the antenna element, with a region facing the rear surface of the antenna element being designated as the capacitive coupling portion 45a, and the radio wave absorber 50 arranged on a rear surface side of the capacitive coupling portion of the tuning plate, to absorb radio waves radiated from the rear surface side of the antenna element. The antenna device 1 further includes an extra-length portion (45b, 45c) of the tuning plate folded back to the rear surface side of the radio wave absorber through the side surface portion of the radio wave absorber, the tuning coated plate 55 arranged on a rear surface side of the radio wave absorber and provided with a metallic plating film formed on a surface thereof, so as to be electrically connected to the grounding portion 45b provided in the extra-length portion of the tuning plate, and the grounding member (the grounding plate 85) electrically connected to the tuning coated plate.

According to the present aspect, by performing continuous matching in the entire frequency band from 600 MHz to 6 GHz by one antenna device, an antenna device that can perform communication with a plurality of types of communication devices having different used frequency bands without switching the antenna device can be provided.

That is, by arranging the radio wave absorber as a member of improving return loss characteristics of the frequency radiated from the antenna element 30 in the entire frequency band, and by arranging the tuning plate and the tuning coated plate as members of improving frequency characteristics in the respective frequency bands, impedance matching is performed in the entire frequency band from 600 MHz to 6 GHz, and the VSWR can be set to 1.8 or less.

<Second and Third Aspects>

In the antenna device 1 according to the present aspect, the tuning frequency with the antenna element 30 is adjusted by varying an area of the capacitive coupling portion 45a of the tuning plate 45.

Further, the tuning frequency of the tuning plate is 1.3 GHz to 4.5 GHz.

According to the present aspects, by capacitively coupling the antenna element and the tuning plate, return loss characteristics in a specific frequency band, specifically, in an intermediate frequency from 1.3 GHz to 4.5 GHz can be improved and matched.

<Fourth and Fifth Aspects>

In the antenna device 1 according to the present aspect, the antenna element 30 and the tuning coated plate 55 are capacitively coupled via the tuning plate 45.

Further, the tuning frequency of the tuning coated plate is 600 MHz to 1.5 GHz.

According to the present aspects, by capacitively coupling the antenna element and the tuning coated plate, return loss characteristics in a specific frequency band, specifically, in a relatively low frequency from 600 MHz to 1.5 GHz can be improved and matched.

<Sixth Aspect>

The antenna device 1 according to the present aspect includes the signal input member 61 including the center conductor 64 electrically connected to the power feeding unit 33 at one end portion 64a in the axial direction, and the external conductor 62 that surrounds the other end portion in the axial direction of the center conductor via the insulator 63. The antenna device 1 further includes the conductive cushions 80a and 80b that are elastically deformable, each having a conductor at least in an outer periphery thereof and holding the external conductor therebetween.

In the present aspect, while the signal input member feeds power to the antenna element 30, by arranging the signal input member between the conductive cushions, frequency characteristics in a relatively high frequency band can be improved.

<Seventh and Eighth Aspects>

In the antenna device 1 according to the present aspect, the conductive cushion 80 is arranged so that a longitudinal direction thereof is extended in a direction intersecting the axial direction of the signal input member 61, and by adjusting the longitudinal length of the conductive cushion, the tuning frequency thereof with the antenna element 30 can be adjusted.

Further, the tuning frequency of the conduction cushion is 4.5 GHz to 6 GHz.

According to the present aspects, return loss characteristics in the frequency range from 4.5 GHz to 6 GHz can be improved by the conductive cushion.

<Ninth Aspect>

In the antenna device 1 according to the present aspect, the grounding member (the grounding plate 85) is conductive with the external conductor 62 of the signal input member 61.

According to the present aspect, the tuning plate 45 and the tuning coated plate 55 are grounded via the grounding member, which contributes to improvement of return loss characteristics and matching in a required frequency band.

<Tenth Aspect>

In the antenna device 2 according to the present aspect, the NFC board 90 is arranged on the surface side of the antenna element 30.

Here, the NFC board is a board that enables two-way communication between an information processing device such as a personal computer, to which a connection terminal for wired communication such as a USB terminal provided in the NFC board can be connected, and a wireless communication terminal capable of performing communication based on the NFC communication standard.

According to the present aspect, when a communication test of a wireless communication terminal is to be performed by using the antenna device, the information processing device can acquire a communication result from the wireless communication terminal via NFC, and the information processing device can transmit a command to generate radio waves corresponding to test contents to the wireless communication terminal via NFC.

REFERENCE SIGNS LIST 1, 2 antenna device, 10 case, 11 base, 12 upper cover, 13 side surface plate, 14 coaxial-member insertion hole, 15 insertion hole, 16 element guide, 17 upper surface plate, 18 side surface plate, 19 USB terminal hole, 30 antenna element, 31 cord, 32 circular outer edge, 33 power feeding unit, 40 first insulating plate, 45 tuning plate, 45a capacitive coupling portion, 45b grounding portion, 45c connecting portion, 50 radio wave absorber, 55 tuning coated plate, 60 coaxial connector, 61 signal input member, 62 external conductor, 63 insulator, 64 center conductor, 64a axial one end portion, 67 flange portion, 68 insertion hole, 71 connector portion, 73 connector plate, 74 screw hole, 75 cable insertion portion, 77 screw, 80 conductive cushion, 80a conductive cushion, 80b conductive cushion, 81 second insulating plate, 81a slit, 85 grounding plate, 85a one end portion, 85b other end portion, 90 NFC board, 91 USB terminal, 300 antenna system, 301 first antenna device, 303 second antenna device, 305 network analyzer, 305m monitor terminal, 307 coaxial cable, 309 coaxial cable, 310 instrumentation system, 311 monitor cable, 313 monitor, 313m terminal, 320 calibration kit, 320L connector, 320S connector, 320T connector, 320o connector

The invention claimed is:

1. An antenna device comprising:
    an antenna element including a circular outer edge in at least a part of an outer edge and a power feeding unit in a part of the circular outer edge;
    a tuning plate arranged opposite to a rear surface side of the antenna element in an insulated state, and configured by a thin plate-like conductor having a length longer than a maximum diameter of the antenna element, with a region facing the rear surface of the antenna element being designated as a capacitive coupling portion;
    a radio wave absorber arranged on a rear surface side of the capacitive coupling portion of the tuning plate, to absorb radio waves radiated from the rear surface side of the antenna element;
    an extra-length portion of the tuning plate folded back to a rear surface side of the radio wave absorber through a side surface portion of the radio wave absorber;
    a tuning coated plate arranged on a rear surface side of the radio wave absorber and provided with a metallic plating film formed on a surface thereof, to be electrically connected to a grounding portion provided in the extra-length portion of the tuning plate; and
    a grounding member electrically connected to the tuning coated plate.

2. The antenna device according to claim 1, wherein a tuning frequency with the antenna element is adjusted by varying an area of the capacitive coupling portion of the tuning plate.

3. The antenna device according to claim 1, wherein a tuning frequency of the tuning plate is 1.3 GHz to 4.5 GHz.

4. The antenna device according to claim 1, wherein the antenna element and the tuning coated plate are capacitively coupled via the tuning plate.

5. The antenna device according to claim 1, wherein a tuning frequency of the tuning coated plate is 600 MHz to 1.5 GHz.

6. The antenna device according to claim 1, further comprising:
    a signal input member including a center conductor electrically connected to the power feeding unit at one end portion in an axial direction, and an external conductor that surrounds the other end portion in the axial direction of the center conductor via an insulator; and
    conductive cushions that are elastically deformable, each having a conductor at least in an outer periphery thereof and holding the external conductor therebetween.

7. The antenna device according to claim 6, wherein the each of conductive cushions is arranged so that a longitudinal direction thereof is extended in a direction intersecting an axial direction of the signal input member, and a tuning frequency thereof with the antenna element is adjusted by adjusting a longitudinal length of each of the conductive cushions.

8. The antenna device according to claim 6, wherein a tuning frequency of each of the conductive cushions is 4.5 GHz to 6 GHz.

9. The antenna device according to claim 6, wherein the grounding member is conductive with the external conductor of the signal input member.

10. The antenna device according to claim 1, wherein an NFC board is arranged on a surface side of the antenna element.

* * * * *